(12) United States Patent
Tanaka

(10) Patent No.: US 10,222,423 B2
(45) Date of Patent: Mar. 5, 2019

(54) ELECTRICAL STORAGE SYSTEM

(71) Applicant: TOYOTA JIDOSHA KABUSHIKI KAISHA, Toyota-shi, Aichi-ken (JP)

(72) Inventor: Hiromasa Tanaka, Okasaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 131 days.

(21) Appl. No.: 15/308,939

(22) PCT Filed: May 11, 2015

(86) PCT No.: PCT/IB2015/000657
§ 371 (c)(1),
(2) Date: Nov. 4, 2016

(87) PCT Pub. No.: WO2015/173617
PCT Pub. Date: Nov. 19, 2015

(65) Prior Publication Data
US 2017/0059658 A1 Mar. 2, 2017

(30) Foreign Application Priority Data

May 12, 2014 (JP) .................... 2014-098604

(51) Int. Cl.
*B60L 3/00* (2006.01)
*G01R 27/18* (2006.01)
(Continued)

(52) U.S. Cl.
CPC ........ *G01R 31/3278* (2013.01); *B60L 3/0023* (2013.01); *G01R 19/16533* (2013.01); *G01R 27/18* (2013.01); *G01R 31/006* (2013.01); *G01R 31/40* (2013.01); *H02J 7/0068* (2013.01); *G01R 31/025* (2013.01); *H02J 7/345* (2013.01)

(58) Field of Classification Search
CPC ...... G01R 31/025; G01R 27/18; G01R 31/40; G01R 31/006; G01R 31/1272; G01R 19/16542; G01R 31/005; G01R 31/3278; B60L 3/0069; B60L 3/0023
See application file for complete search history.

(56) References Cited

U.S. PATENT DOCUMENTS 5,818,236 A 10/1998 Sone et al.
2015/0054516 A1* 2/2015 Iisaka .................. B60L 3/0069
324/418

FOREIGN PATENT DOCUMENTS

JP 8-226950 9/1996

* cited by examiner

*Primary Examiner* — Ryan Johnson
(74) *Attorney, Agent, or Firm* — Finnegan, Henderson, Farabow, Garrett & Dunner, LLP

(57) ABSTRACT

An electrical storage system includes an electrical storage device, a load, a line, a relay, a capacitor, a voltage sensor, a first insulation resistor, a second insulation resistor, a first current path, a second current path, and a controller. The capacitor has one end connected to the electrical storage device and the other end connected to a ground. The voltage sensor is configured to detect a voltage value of the capacitor. The first insulation resistor is provided between the electrical storage device and the ground. The second insulation resistor is disposed between the load and the ground. The first current path includes the first insulation resistor. The second current path includes the line and the second insulation resistor. The controller is configured to control ON and OFF of the relay.

10 Claims, 9 Drawing Sheets

(51) Int. Cl.
  *G01R 31/02* (2006.01)
  *G01R 31/327* (2006.01)
  *G01R 31/00* (2006.01)
  *G01R 31/40* (2014.01)
  *G01R 19/165* (2006.01)
  *H02J 7/00* (2006.01)
  *H02J 7/34* (2006.01)

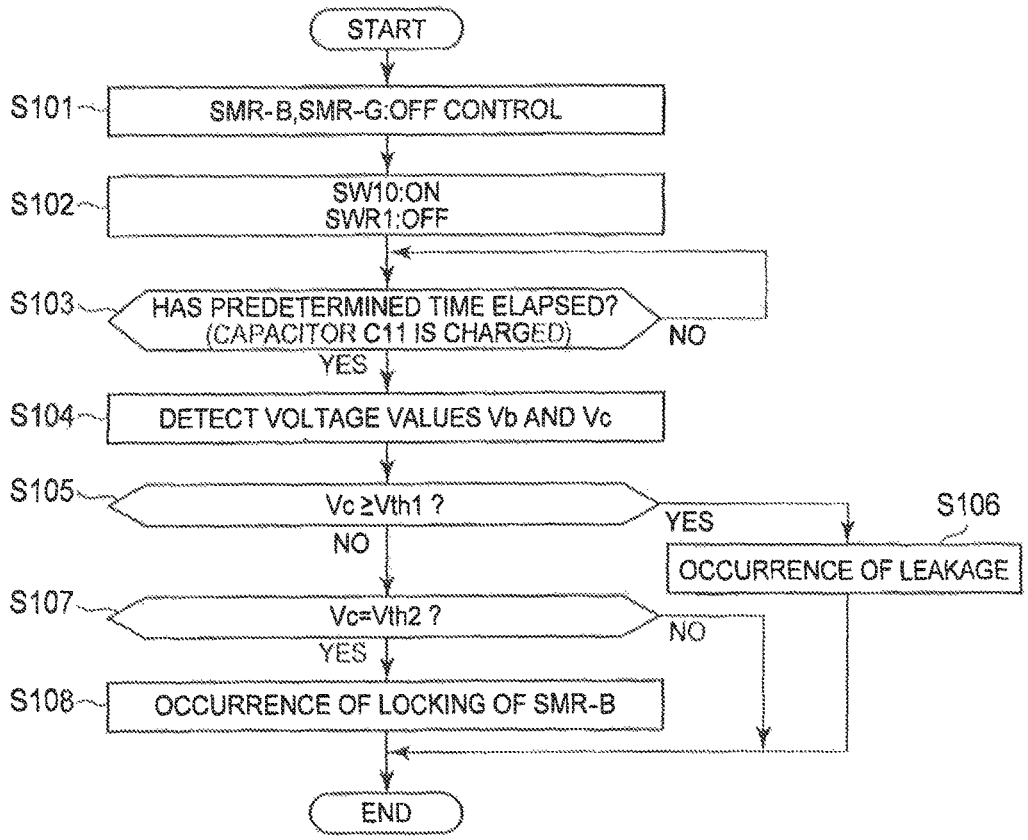
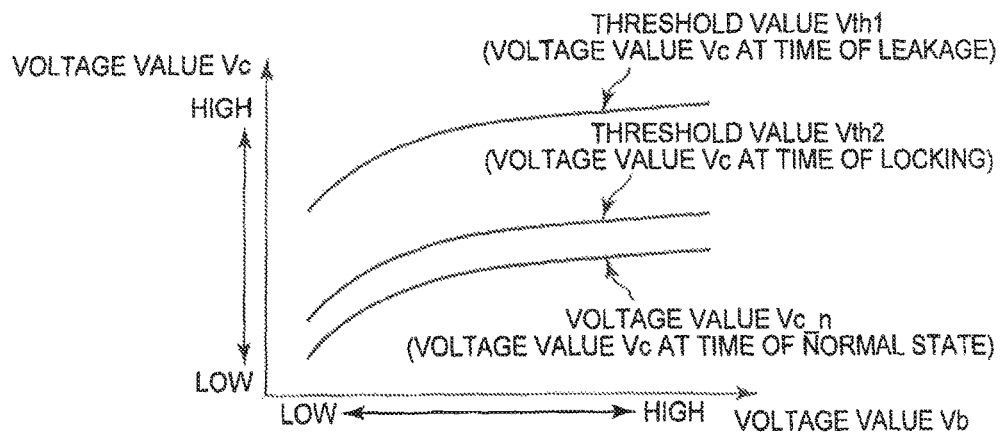

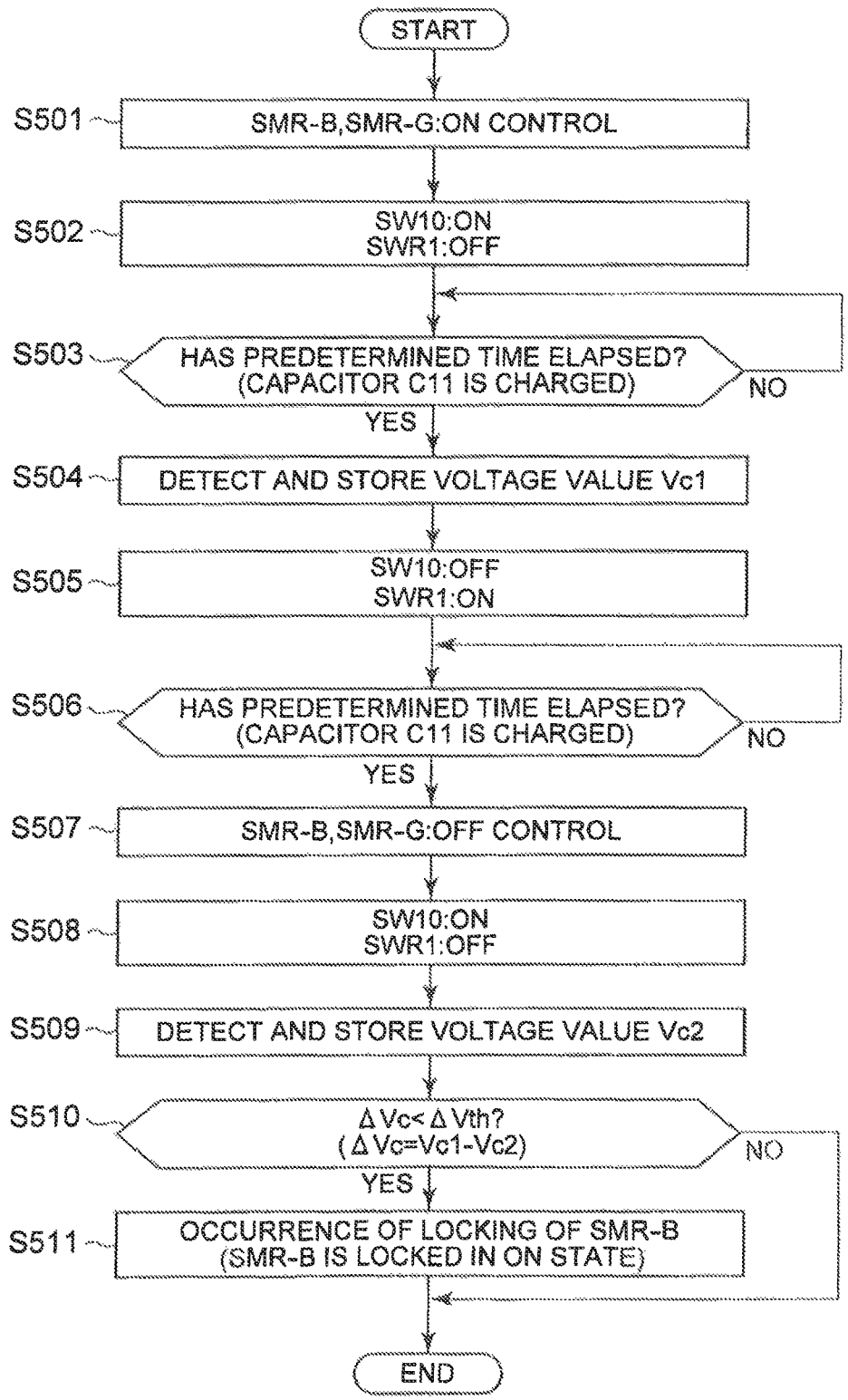

ELECTRICAL STORAGE SYSTEM

CROSS-REFERENCE TO RELATED APPLICATIONS

This application is a national phase application of International Application No. PCT/IB2015/000657, filed May 11, 2015, and claims the priority of Japanese Application No. 2014-098604, filed May 12, 2014, the content of both of which is incorporated herein by reference.

BACKGROUND OF THE INVENTION

1. Field of the Invention

The invention relates to an electrical storage system capable of determining whether or not a relay for connecting an electrical storage device to a load is locked in an ON state.

2. Description of Related Art

In Japanese Patent Application Publication No. 08-226950 (JP 08-226950 A), a capacitor is connected to a main circuit wiring connected to a power supply, and an insulation resistance between the main circuit wiring and a ground (GND) potential portion is calculated based on the voltage value of the capacitor. Herein, one end of the capacitor is connected to the main circuit wiring on a positive side and the other end of the capacitor is grounded.

When the insulation resistance between the main circuit wiring on a negative side and the GND potential portion is reduced, a discharge current of the power supply flows to the main circuit wiring on the positive side, the capacitor, the GND potential portion, and the main circuit wiring on the negative side in this order, and the capacitor is thereby charged. Accordingly, it is possible to determine an insulation state between the main circuit wiring on the negative side and the GND potential portion by detecting the voltage value of the capacitor.

SUMMARY OF THE INVENTION

JP 08-226950 A merely determines the insulation state of the main circuit wiring (e.g., a leakage of the power supply). Herein, as described in JP 08-226950 A, a relay is used in order to connect the power supply to the load (a charging circuit and a motor described in JP 08-226950 A) and disconnect the power supply from the load. The relay is constituted by a movable contact and a fixed contact and, when the movable contact is locked to the fixed contact, there are cases where the relay is kept ON. To cope with this, it is necessary to determine whether or not the relay has been locked.

According to an aspect of the invention, an electrical storage system includes an electrical storage device, a load, a line, a relay, a capacitor, a voltage sensor, a first insulation resistor, a second insulation resistor, a first current path, a second current path, and a controller. The line is configured to connect the electrical storage device and the load. The relay is provided in the line. The capacitor has one end connected to the electrical storage device and the other end connected to a GND. The voltage sensor is configured to detect a voltage value of the capacitor. The first insulation resistor is disposed between the electrical storage device and the GND. The second insulation resistor is disposed between the load and the GND. The first current path includes the first insulation resistor. The second current path includes the line and the second insulation resistor.

The controller is configured to control ON and OFF of the relay. The controller is configured to determine that the relay is locked in an ON state when the voltage value of the capacitor in a case where control for turning OFF the relay is performed is substantially equal to a second voltage value. Herein, a first resistance value is higher than a second resistance value, and the second voltage value is higher than a first voltage value. The first resistance value is a resistance value of the first insulation resistor. The second resistance value is a resistance value of the second insulation resistor. The first voltage value is a voltage value when a discharge current of the electrical storage device flows to the capacitor in the first current path. The second voltage value is a voltage value when the discharge current of the electrical storage device flows to the capacitor in the second current path.

According to the above aspect, it is determined whether or not the relay is locked in the ON state by focusing attention on the magnitude relationship between the resistance values of the first insulation resistor and the second insulation resistor.

When the resistance value of the first insulation resistor is higher than the resistance value of the second insulation resistor, the first voltage value and the second voltage value have the above magnitude relationship. Herein, when the relay is locked in the ON state in spite of the fact that the relay is controlled to be OFF, the discharge current of the electrical storage device flows in the second current path, and the capacitor is charged. In this case, the voltage value detected by the voltage sensor is substantially equal to the second voltage value, and hence it can be determined that the relay is locked in the ON state.

The voltage value of the capacitor is substantially equal to the first voltage value when the relay is OFF, and the voltage value of the capacitor is substantially equal to the second voltage value when the relay is ON. Herein, since the first voltage value and the second voltage value have the above magnitude relationship, it is possible to determine the locking of the relay in the ON state while distinguishing between the case where the relay is OFF and the case where the relay is ON.

According to another aspect of the invention, an electrical storage system includes an electrical storage device, a load, a line, a relay, a capacitor, a voltage sensor, a first insulation resistor, a second insulation resistor, a first current path, a second current path, and a controller. The line is configured to connect the electrical storage device and the load. The relay is provided in the line. The capacitor has one end connected to the electrical storage device and the other end connected to a GND. The voltage sensor is configured to detect a voltage value of the capacitor. The first insulation resistor is disposed between the electrical storage device and the GND. The second insulation resistor is disposed between the load and the GND. The first current path includes the first insulation resistor. The second current path includes the line and the second insulation resistor. The controller is configured to control ON and OFF of the relay, and determine that the relay is locked in an ON state when a voltage difference in a case where control for switching the relay between ON and OFF is performed is smaller than a difference between a first voltage value and a second voltage value.

Herein, a first resistance value is higher than a second resistance value, and the first voltage value is lower than the second voltage value. The first resistance value is a resistance value of the first insulation resistor. The second resistance value is a resistance value of the second insulation resistor. The first voltage value is a voltage value when a discharge current of the electrical storage device flows to the capacitor in the first current path. The second voltage value is a voltage value when the discharge current of the electrical storage device flows to the capacitor in the second current path. The voltage difference is a voltage difference between the voltage value of the capacitor detected by the voltage sensor when control for turning ON the relay is performed and the voltage value of the capacitor detected by the voltage sensor when control for turning OFF the relay is performed.

When the relay is locked in the ON state, even when the control for turning ON or OFF the relay is performed, the voltage values detected by the voltage sensor are substantially equal to each other. The voltage different at this point is smaller than the difference between the first voltage value and the second voltage value. Consequently, when the voltage difference is smaller than the difference between the first voltage value and the second voltage value, it can be determined that the relay is locked in the ON state.

In addition, by calculating the voltage difference, it is possible to determine whether or not the relay is locked in the ON state in a state in which variations in the capacitance of the capacitor are not considered. When variations occur in the capacitance of the capacitor, the voltage value of the capacitor detected by the voltage sensor is displaced from the first voltage value or the second voltage value. In this case, it becomes difficult to determine whether or not the voltage value of the capacitor is substantially equal to the second voltage value, and it becomes difficult to determine whether or not the relay is locked in the ON state.

Herein, when variations occur in the capacitance of the capacitor, the voltage value of the capacitor is displaced in the same direction (a high side or a low side of the voltage value) relative to the first voltage value or the second voltage value. Accordingly, when the relay is not locked in the ON state, the voltage difference at this point corresponds to the difference between the first voltage value and the second voltage value. On the other hand, when the relay is locked in the ON state, the voltage difference at this point is smaller than the difference between the first voltage value and the second voltage value. Consequently, by focusing attention on the voltage difference, it is possible to determine whether or not the relay is locked in the ON state in the state in which variations in the capacitance of the capacitor are not considered.

In the above aspect, the capacitor may include a first capacitor and a second capacitor. The second capacitor is connected in parallel to the first capacitor. A capacitance of the second capacitor is smaller than a capacitance of the first capacitor. A first switch element may be connected in series to the first capacitor. A second switch element may be connected in series to the second capacitor and connected in parallel to the first capacitor and the first switch element.

Herein, the controller may be configured to turn ON the first switch element and turn OFF the second switch element when the controller determines an occurrence of a leakage resulting from a reduction in the first resistance value. The controller may be configured to determine that the leakage resulting from the reduction in the first resistance value has occurred when the voltage value detected by the voltage sensor is higher than or equal to a third voltage value. The third value is a value higher than the second voltage value. In addition, the controller may be configured to turn OFF the first switch element and turn ON the second switch element when the controller determines the locking of the relay.

With this, the first capacitor is charged with the discharge current of the electrical storage device when the occurrence of the leakage is determined, and the second capacitor is charged with the discharge current of the electrical storage device when the locking of the relay is determined. Thus, by appropriately using the first capacitor or the second capacitor as the situation demands, it is possible to determine the occurrence of the leakage, and it becomes easier to determine whether or not the relay is locked in the ON state.

When the resistance value of the first insulation resistor is reduced, the current value in the first current path is increased, and hence it is preferable to use the first capacitor having the capacitance larger than that of the second capacitor. With this, it is possible to determine whether or not the leakage has occurred based on whether or not the voltage value of the first capacitor is not less than the third voltage value. Herein, since each of the first voltage value and the second voltage value is lower than the third voltage value, in the case where only the first capacitor is used, it becomes difficult to distinguish between the first voltage value and the second voltage value. To cope with this, by using the second capacitor having the capacitance smaller than that of the first capacitor, it becomes easier to distinguish between the first voltage value and the second voltage value. With this, it becomes easier to determine whether or not the relay is locked in the ON state based on the voltage value of the second capacitor.

In the above aspect, the controller may be configured to determine that the first switch element is faulty in an OFF state when control for turning ON the first switch element is performed and control for turning OFF the second switch element is performed and when the voltage value detected by the voltage sensor is substantially 0, and determine that the second switch element is faulty in an ON state when the voltage value detected by the voltage sensor is lower than a fourth voltage value. The fourth voltage value is a voltage value when the discharge current of the electrical storage device flows to the first capacitor in the first current path or the second current path. Thus, when the control for turning ON the first switch element is performed and the control for turning OFF the second switch element is performed, it is possible to determine whether or not the first switch element or the second switch element is faulty based on the voltage value detected by the voltage sensor.

Specifically, when the voltage value detected by the voltage sensor is substantially zero (0 [V]), the controller determines that the first switch element is faulty in the OFF state. When the first switch element is controlled to be ON and the first switch element operates according to this control, the first capacitor is charged with the discharge current of the electrical storage device. Herein, when the voltage value (the voltage value of the first capacitor) detected by the voltage sensor is substantially zero (0 [V]), the first capacitor is not charged. With this, it can be determined that the first switch element is faulty in the OFF state.

In addition, when the voltage value detected by the voltage sensor is lower than the voltage value when the discharge current of the electrical storage device flows to the first capacitor in the first current path or the second current path, the controller determines that the second switch element is faulty in the ON state. When the second switch element is controlled to be OFF and the second switch element operates according to this control, as described above, only the first capacitor is charged with the discharge current of the electrical storage device. When the voltage value detected by the voltage sensor is lower than the voltage value when only the first capacitor is charged, it can be seen that the second capacitor is also charged. With this, it can be determined that the second switch element is faulty in the ON state.

In the above aspect, the controller may be configured to determine that the second switch element is faulty in the OFF state when control for turning OFF the first switch element is performed and control for turning ON the second switch element is performed and when the voltage value detected by the voltage sensor is substantially 0, and determine that the first switch element is faulty in the ON state when the voltage value detected by the voltage sensor is lower than a fifth voltage value. The fifth voltage value is a voltage value when the discharge current of the electrical storage device flows to the second capacitor in the first current path or the second current path. When the control for turning OFF the first switch element is performed and the control for turning ON the second switch element is performed, similarly to the above-described case, it is possible to determine whether or not the first switch element or the second switch element is faulty based on the voltage value detected by the voltage sensor. Specifically, when the voltage value detected by the voltage sensor is substantially 0 [V], the controller determines that the second switch element is faulty in the OFF state. In addition, when the voltage value detected by the voltage sensor is lower than the voltage value when the discharge current of the electrical storage device flows to the second capacitor in the first current path or the second current path, the controller determines that the first switch element is faulty in the ON state.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 5 is a flowchart showing a process of determining a leakage of the battery pack and locking of the system main relay in the first embodiment;

FIG. 6 is a view showing a relationship between a voltage value of the battery pack and a voltage value of a capacitor;

FIG. 13 is a flowchart showing a process of determining the locking of the system main relay in a fourth embodiment.

DETAILED DESCRIPTION OF EMBODIMENTS

Hereinbelow, embodiments of the invention will be described.

Figure 1:
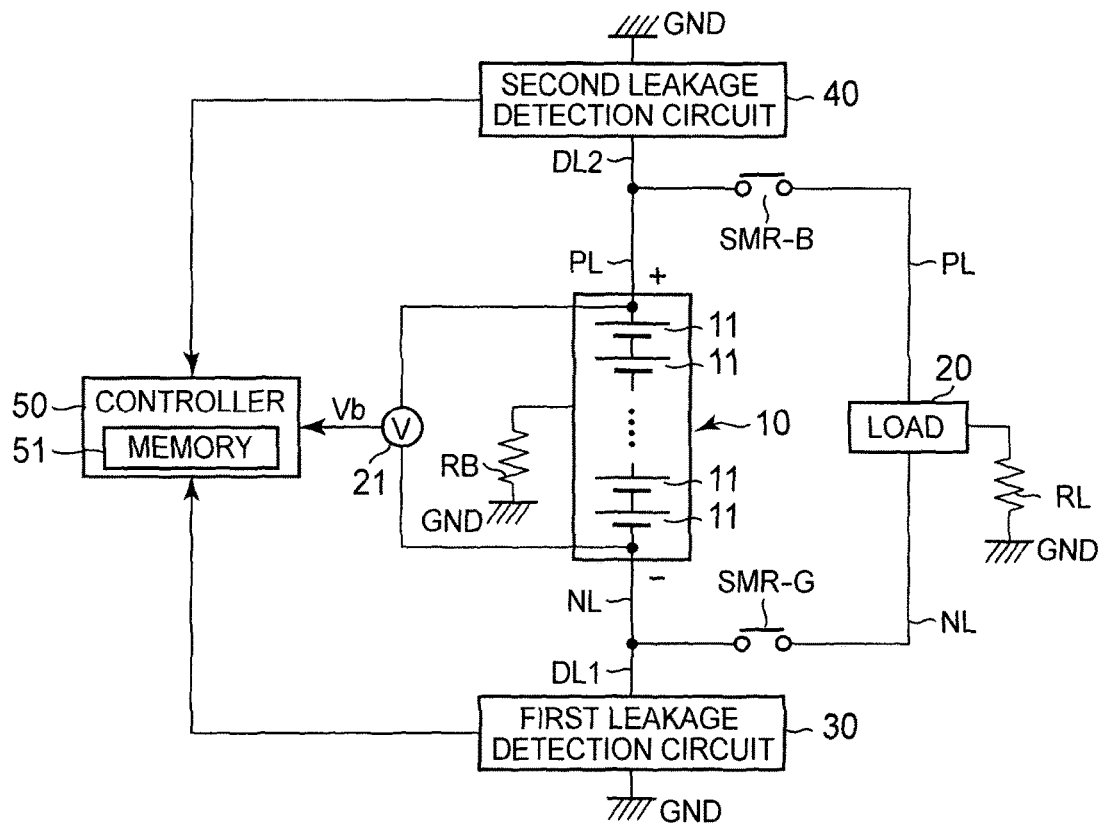
FIG. 1 is a view showing a configuration of a battery system.

A battery system of the embodiment (corresponds to an electrical storage system of the invention) will be described by using FIG. 1. A battery pack (corresponds to an electrical storage device of the invention) 10 has a plurality (arbitrary number) of single cells 11 that are connected in series to each other. As the single cell 11, it is possible to use a secondary battery such as a nickel-metal hydride battery or a lithium-ion battery. It is also possible to use an electric double layer capacitor instead of the secondary battery. Note that a plurality of the single cells 11 that are connected in parallel to each other may be included in the battery pack 10.

The battery pack 10 is disposed in a state in which the battery pack 10 is insulated from a GND. A resistance element RB denotes an insulation resistor (corresponds to a first insulation resistor of the invention) between the battery pack 10 and the GND. For example, when the battery pack 10 is mounted on a vehicle, a vehicle body to which the battery pack 10 is fixed serves as the GND.

A positive electrode line PL is connected to a positive electrode terminal of the battery pack 10, and a negative electrode line NL is connected to a negative electrode terminal of the battery pack 10. The battery pack 10 is connected to a load 20 via the positive electrode line PL and the negative electrode line NL. The load 20 is disposed in a state in which the load 20 is insulated from the GND. A resistance element RL denotes an insulation resistor (corresponds to a second insulation resistor of the invention) between the load 20 and the GND. For example, when the load 20 is mounted on the vehicle, the vehicle body to which the load 20 is fixed serves as the GND.

The resistance value of the resistance element RB is higher than the resistance value of the resistance element RL. For example, the resistance values of the resistance elements RB and RL are different in the number of digits. The load 20 includes an electronic component connected to the GND, and hence the resistance value of the resistance element RL tends to be low. On the other hand, the battery pack 10 serves as a high-voltage power supply, and hence it is necessary to secure insulation between the battery pack 10 and the GND, and the resistance value of the resistance element RB tends to be high. Consequently, the resistance value of the resistance element RB is higher than the resistance value of the resistance element RL. In the embodiment, as will be described later, a reduction in the resistance value of the resistance element RB is considered. On the other hand, the resistance value of the resistance element RL is considered to be a fixed value.

When the battery pack 10 is mounted on the vehicle, a motor generator is connected to the battery pack 10. In addition, there are cases where an inverter and a step-up circuit are provided in a current path between the battery pack 10 and the motor generator. In these cases, the load 20 includes the motor generator, the inverter, and the step-up circuit. On the other hand, some vehicles on which the battery packs 10 are mounted can charge the battery packs 10 by using electric power from a power supply (external power supply) provided outside the vehicle. In this case, there are cases where a charger is mounted on the vehicle, and the load 20 also includes the charger. The charger converts AC power supplied from the external power supply to DC power, and output the DC power to the battery pack 10.

A system main relay SMR-B provided in the positive electrode line PL receives a control signal from a controller 50, and is switched between ON and OFF. A system main relay SMR-G provided in the negative electrode line NL receives the control signal from the controller 50, and is switched between ON and OFF. A voltage sensor 21 detects a voltage value Vb of the battery pack 10, and outputs the detection result to the controller 50. The controller 50 has a memory 51, and information for execution of predetermined processes by the controller 50 is stored in the memory 51.

One end of a first leakage detection circuit 30 is connected to the GND, and the other end thereof is connected to the negative electrode line NL via a detection line DL1. The first leakage detection circuit 30 is used for determining whether or not a reduction in the insulation resistance (the resistance value of the resistance element RB) of the battery pack 10, i.e., a leakage of the battery pack 10 has occurred. In addition, the first leakage detection circuit 30 is used for determining whether or not the system main relay SMR-B is locked in an ON state.

One end of a second leakage detection circuit 40 is connected to the GND, and the other end thereof is connected to the positive electrode line PL via a detection line DL2. The second leakage detection circuit 40 is used for determining whether or not a reduction in the insulation resistance (the resistance value of the resistance element RB) of the battery pack 10, i.e., the leakage of the battery pack 10 has occurred. In addition, the second leakage detection circuit 40 is used for determining whether or not the system main relay SMR-G is locked in the ON state. Hereinafter, the locking of the system main relay SMR-B or the system main relay SMR-G in the ON state is simply referred to as the locking. The specific configuration of each of the first leakage detection circuit 30 and the second leakage detection circuit 40 will be described later.

Next, a circuit for driving the system main relays SMR-B and SMR-G will be described by using FIG. 2.

Each of the system main relays SMR-B and SMR-G has a movable contact MC and a fixed contact FC. When each of the system main relays SMR-B and SMR-G is OFF, the movable contact MC receives a biasing force from a biasing member (not shown) and is spaced apart from the fixed contact FC. When the controller 50 switches a switch element 61 from OFF to ON, a current flows to a coil 63 from a power supply 62, and an electromagnetic force is thereby generated in the coil 63. The electromagnetic force causes the movable contact MC to come in contact with the fixed contact FC against the biasing force of the biasing member described above. With this, each of the system main relays SMR-B and SMR-G is turned ON. When the battery pack 10 is mounted on the vehicle, it is possible to use an auxiliary battery mounted on the vehicle as the power supply 62. In addition, it is also possible to use the battery pack 10 as the power supply 62.

Figure 2:
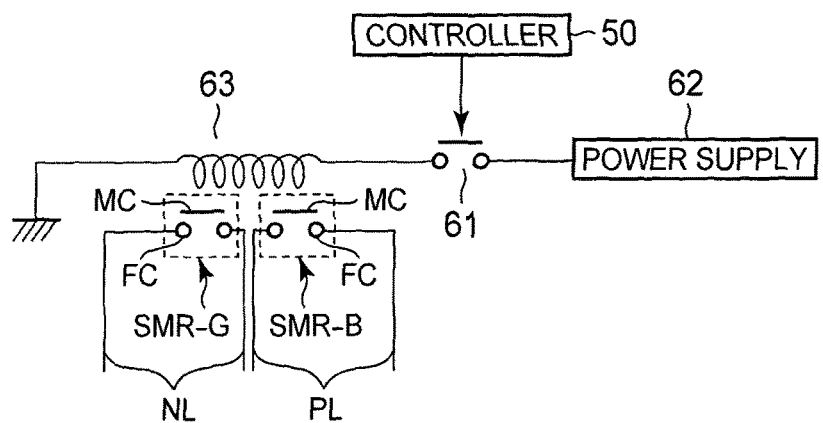
FIG. 2 is a view showing a configuration of a circuit that drives system main relays.

In the configuration shown in FIG. 2, by switching between energization and de-energization of the coil 63, it is possible to cause the movable contacts MC of the two system main relays SMR-B and SMR-G to operate at the same time. Note that it is possible to provide the switch element 61 and the coil 63 in each of the system main relays SMR-B and SMR-G In this case, by switching between the energization and the de-energization of each coil 63, it is possible to cause the movable contacts MC of the two system main relays SMR-B and SMR-G to operate individually.

Next, the configuration of the first leakage detection circuit 30 will be described by using FIG. 3.

One end of the first leakage detection circuit 30 is connected to the GND, and the other end thereof is connected to the negative electrode terminal of the battery pack 10 via the detection line DL1 and the negative electrode line NL. A cathode of a diode D1 is connected to the negative electrode terminal of the battery pack 10 via the detection line DL1 and the negative electrode line NL. An anode of the diode D1 is connected to one end of a switch element SW10. One end of a capacitor C11 is connected to the other end of the switch element SW10, and the other end of the capacitor C11 is connected to the GND.

A switch element SWR1 and a resistance element R1 are electrically connected in parallel to the capacitor C11. The switch element SWR1 and the resistance element R1 are connected in series to each other. Each of the switch elements SW10 and SWR1 receives the control signal from the controller 50, and is switched between ON and OFF. A voltage sensor 31 detects a voltage value Vc of the capacitor C11, and outputs the detection result to the controller 50.

Figure 3:
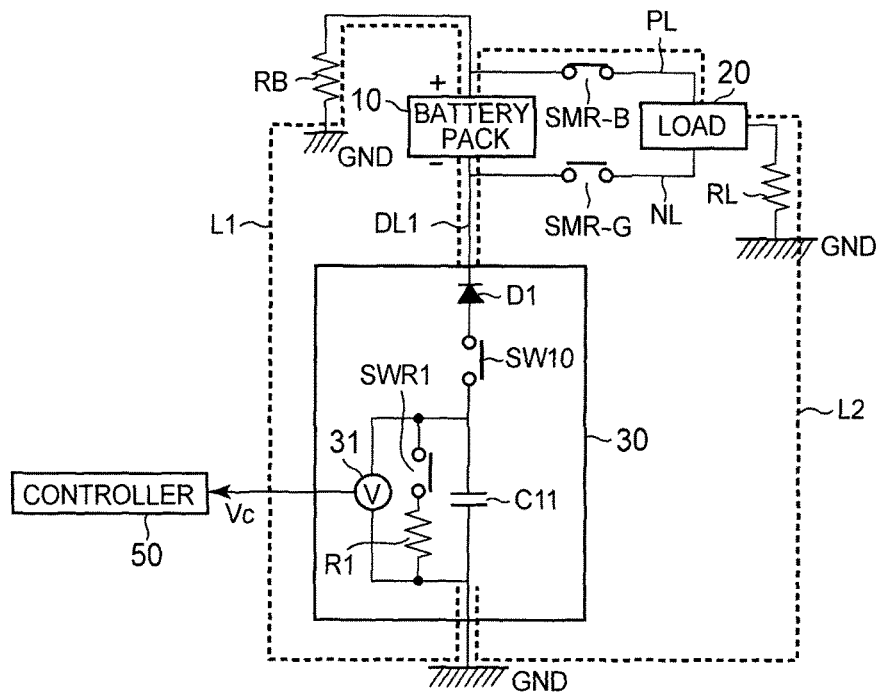
FIG. 3 is a view for explaining a path in which a discharge current of a battery pack flows to a first leakage detection circuit in a first embodiment.

When it is determined whether or not the leakage of the battery pack 10 has occurred, a current path (corresponds to a first current path of the invention) L1 indicated by a dotted line in FIG. 3 is used. When the leakage of the battery pack 10 has occurred, the resistance value of the resistance element RB is reduced. Herein, when the switch element SW10 is turned ON, the discharge current of the battery pack 10 flows in the current path L1, and charge is accumulated in the capacitor C11. With this, the voltage value Vc of the capacitor C11 becomes more likely to increase.

On the other hand, when the leakage of the battery pack 10 is not present, even in the case where the switch element SW10 is turned ON, the discharge current of the battery pack 10 becomes less likely to flow in the current path L1, and the charge becomes less likely to be accumulated in the capacitor C11. With this, the voltage value Vc of the capacitor C11 becomes less likely to increase. As described above, the voltage value Vc of the capacitor C11 differs depending on whether or not the leakage of the battery pack 10 has occurred. Consequently, by detecting the voltage value Vc of the capacitor C11, it is possible to determine whether or not the leakage of the battery pack 10 has occurred.

When it is determined whether or not the system main relay SMR-B is locked, a current path (corresponds to a second current path of the invention) L2 indicated by the dotted line in FIG. 3 is used. When the leakage of the battery pack 10 is not present and the system main relay SMR-B is locked, in the case where the switch element SW10 is turned ON, the discharge current of the battery pack 10 flows in the current path L2. Since the resistance value of the resistance element RL is lower than the resistance value of the resistance element RB, the discharge current of the battery pack 10 flows in the current path L2. With this, by the current flowing in the current path L2, the charge is accumulated in the capacitor C11, and the voltage value Vc of the capacitor C11 increases.

When the system main relay SMR-B is not locked and is OFF, even in the case where the switch element SW10 is turned ON, the discharge current of the battery pack 10 becomes less likely to flow in the current path L2. That is, when the system main relay SMR-B is OFF, the discharge current of the battery pack 10 flows in the current path L1.

In this case, as described above, the charge becomes less likely to be accumulated in the capacitor C11, and the voltage value Vc of the capacitor C11 becomes less likely to increase.

As described above, the voltage value Vc of the capacitor C11 differs depending on whether or not the system main relay SMR-B is locked. Consequently, by detecting the voltage value Vc of the capacitor C11, it is possible to determine whether or not the system main relay SMR-B is locked.

It is possible to pre-set the resistance value of the resistance element RB when it is determined that the leakage of the battery pack 10 has occurred as a threshold value $R_{RB\_}th$. Normally, the threshold value $R_{RB\_}th$ is set to a value lower than the resistance value of the resistance element RL. Consequently, the current value when the resistance value of the resistance element RB becomes equal to the threshold value $R_{RB\_}th$ and the current flows in the current path L1 is larger than the current value when the system main relay SMR-B is locked and the current flows in the current path L2.

Consequently, the voltage value Vc of the capacitor C11 when it is determined that the leakage of the battery pack 10 has occurred is higher than the voltage value Vc of the capacitor C11 when the system main relay SMR-B is locked. With this, it is possible to distinguish between the case where the leakage of the battery pack 10 has occurred and the case where the system main relay SMR-B is locked based on the voltage value Vc of the capacitor C11.

By turning OFF the switch element SW10 and turning ON the switch element SWR1 after the charge is accumulated in the capacitor C11, it is possible to discharge the capacitor C11 via the resistance element R1. With this, in a state in which the voltage value Vc of the capacitor C11 is 0 [V], it is possible to repeat the determination of whether or not the leakage of the battery pack 10 has occurred and the determination of whether or not the system main relay SMR-B is locked.

Next, the configuration of the second leakage detection circuit 40 will be described by using FIG. 4.

One end of the second leakage detection circuit 40 is connected to the GND, and the other end thereof is connected to the positive electrode terminal of the battery pack 10 via the detection line DL2 and the positive electrode line PL. The anode of a diode D2 is connected to the positive electrode terminal of the battery pack 10 via the detection line DL2 and the positive electrode line PL. The cathode of the diode D2 is connected to one end of a switch element SW20. One end of a capacitor C21 is connected to the other end of the switch element SW20, and the other end of the capacitor C21 is connected to the GND. As the capacitor C21, it is possible to use a capacitor having the same capacitance as that of the capacitor C11 or having a capacitance different from that of the capacitor C11.

A switch element SWR2 and a resistance element R2 are electrically connected in parallel to the capacitor C21. The switch element SWR2 and the resistance element R2 are electrically connected in series to each other. Each of the switch elements SW20 and SWR2 receives the control signal from the controller 50, is switched between ON and OFF. A voltage sensor 41 detects the voltage value Vc of the capacitor C21, and outputs the detection result to the controller 50.

Figure 4:
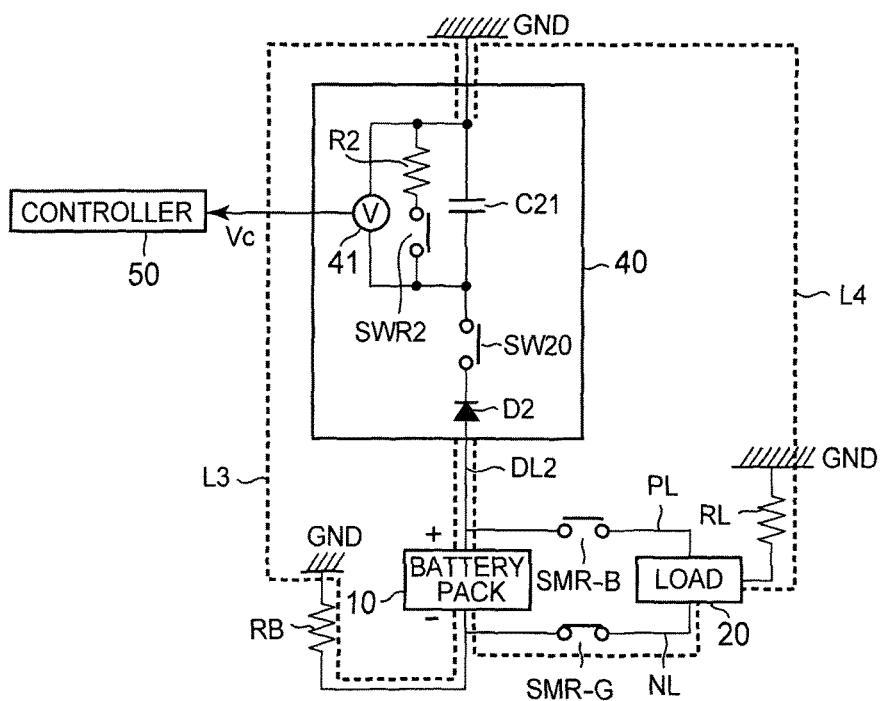
FIG. 4 is a view for explaining a path in which the discharge current of the battery pack flows to a second leakage detection circuit in the first embodiment.

When it is determined whether or not the leakage of the battery pack 10 has occurred, a current path (corresponds to the first current path of the invention) L3 indicated by the dotted line in FIG. 4 is used. When the system main relays SMR-B and SMR-G are OFF, in the case where the switch element SW20 is turned ON, the discharge current of the battery pack 10 flows in the current path L3, and the charge is accumulated in the capacitor C21. Similarly to the case described by using FIG. 3, the voltage value Vc of the capacitor C21 differs depending on whether or not the leakage of the battery pack 10 has occurred. Accordingly, by detecting the voltage value Vc of the capacitor C21, it is possible to determine whether or not the leakage of the battery pack 10 has occurred.

When it is determined whether or not the system main relay SMR-G is locked, a current path (corresponds to the second current path of the invention) L4 indicated by the dotted line in FIG. 4 is used. When the leakage of the battery pack 10 is not present and the system main relay SMR-G is locked, in the case where the switch element SW20 is turned ON, the discharge current of the battery pack 10 flows in the current path L4, and the charge is accumulated in the capacitor C21. Similarly to the case described by using FIG. 3, the voltage value Vc of the capacitor C21 differs depending on whether or not the system main relay SMR-G is locked. Accordingly, by detecting the voltage value Vc of the capacitor C21, it is possible to determine whether or not the system main relay SMR-G is locked.

On the other hand, similarly to the case described by using FIG. 3, the voltage value Vc of the capacitor C21 when it is determined that the leakage of the battery pack 10 has occurred is higher than the voltage value Vc of the capacitor C21 when the system main relay SMR-G is locked. With this, it is possible to distinguish between the case where the leakage of the battery pack 10 has occurred and the case where the system main relay SMR-G is locked based on the voltage value Vc of the capacitor C21.

By turning OFF the switch element SW20 and turning ON the switch element SWR2 after the charge is accumulated in the capacitor C21, it is possible to discharge the capacitor C21 via the resistance element R2. With this, in a state in which the voltage value Vc of the capacitor C21 is 0 [V], it is possible to repeat the determination of whether or not the leakage of the battery pack 10 has occurred and the determination of whether or not the system main relay SMR-G is locked.

Next, a process of determining whether or not the leakage of the battery pack 10 or the locking of the system main relay SMR-B has occurred will be described by using a flowchart shown in FIG. 5. The flowchart shown in FIG. 5 is executed by the controller 50.

Note that the process shown in FIG. 5 is the process that uses the first leakage detection circuit 30, but the similar process can be performed by using the second leakage detection circuit 40. Consequently, the detailed description of the process that uses the second leakage detection circuit 40 will be omitted. Herein, when the second leakage detection circuit 40 is used, it is possible to determine whether or not the leakage of the battery pack 10 has occurred and whether or not the system main relay SMR-G has been locked.

When the process similar to the process shown in FIG. 5 is performed by using the second leakage detection circuit 40, the switch elements SW20 and SWR2 are used instead of the switch elements SW10 and SWR1, and the voltage value Vc is detected by the voltage sensor 41. Herein, as each of threshold values Vth1 and Vth2 described later, the voltage value Vc corresponding to the capacitance of the capacitor C21 is set In step S101, the controller 50 outputs the control signal for turning OFF the system main relays SMR-B and SMR-G Note that, when the system main relays SMR-B and SMR-G can be operated individually, it may be only necessary to output the control signal for turning OFF the system main relay SMR-B.

In step S102, the controller 50 turns ON the switch element SW10 and turns OFF the switch element SWR1. In step S103, the controller 50 stands by until predetermined time elapses from the end of the process in step S102. The capacitor C11 is charged with the current flowing in the current path L1 or the current path L2 shown in FIG. 3 for the lapse of the predetermined time.

When the predetermined time has elapsed in the process in step S103, in step S104, the controller 50 detects the voltage value Vb by using the voltage sensor 21, and also detects the voltage value Vc of the capacitor C11 by using the voltage sensor 31. In step S105, the controller 50 determines whether or not the voltage value Vc detected in the process in step S104 is not less than the threshold value Vth1.

The threshold value (corresponds to a third voltage value of the invention) Vth1 is a threshold value (the voltage value Vc) for determining whether or not the leakage of the battery pack 10 has occurred, and can be pre-set. Specifically, as described above, when the resistance value (threshold value) $R_{RB\_th}$ of the resistance element RB when it is determined that the leakage of the battery pack 10 has occurred is pre-set, it is possible to set the threshold value Vth1 based on the threshold value $R_{RB\_th}$. The voltage value Vc of the capacitor C11 is dependent on the voltage value Vb of the battery pack 10, and hence the threshold value Vth1 can be changed in accordance with the voltage value Vb.

Specifically, as shown in FIG. 6, when a correspondence (a map or an arithmetic expression) between the threshold value (the voltage value Vc) Vth1 and the voltage value Vb is prepared in advance, by detecting the voltage value Vb, it is possible to determine the threshold value Vth1 corresponding to the voltage value Vb. Note that there are cases where the voltage value Vc of the capacitor C11 is less likely to change even when the voltage value Vb changes. In these cases, it is not necessary to change the threshold value Vth1 in accordance with the voltage value Vb, and it is possible to set a fixed value as the threshold value Vth1.

When the voltage value Vc is not less than the threshold value Vth1, in step S106, the controller 50 determines that the leakage of the battery pack 10 has occurred. When the leakage of the battery pack 10 has occurred, normally, the resistance value of the resistance element RB becomes equal to the threshold value $R_{RB\_th}$ described above. Consequently, when the voltage value Vc corresponds to the threshold value Vth1, it can be determined that the leakage of the battery pack 10 has occurred.

Herein, when a detection error of the voltage sensor 31 is considered, in the case where the voltage value Vc falls within the range of the detection error having the threshold value Vth1 as a reference, it can be determined that the leakage of the battery pack 10 has occurred. The range of the detection error having the threshold value Vth1 as the reference denotes a range between a value (upper limit value) obtained by adding a predetermined detection error to the threshold value Vth1 and a value (lower limit value) obtained by subtracting the predetermined detection error from the threshold value Vth1.

On the other hand, depending on the leakage state of the battery pack 10, there are cases where the resistance value of the resistance element RB becomes lower than the threshold value $R_{RB\_th}$ described above. In these cases, the voltage value Vc becomes higher than the threshold value Vth1. In consideration of this point, in the process in step S105, it is determined whether or not the voltage value Vc is not less than the threshold value Vth1.

In the process in step S106, the controller 50 can set, e.g., a flag related to the occurrence of the leakage (leakage flag). On the other hand, in the process in step S105, when the voltage value Vc is lower than the threshold value Vth1, the controller 50 determines that the leakage of the battery pack 10 is not present.

Subsequently, in step S107, the controller 50 determines whether or not the voltage value Vc detected in the process in step S104 is equal to the threshold value (corresponds to a second voltage value of the invention) Vth2. Herein, in consideration of the detection error of the voltage sensor 31, in the process in step S107, it is also possible to determine whether or not the voltage value Vc falls within the range of the detection error having the threshold value Vth2 as a reference. That is, it is possible to determine whether or not the voltage value Vc is substantially equal to the threshold value Vth2. The range of the detection error having the threshold value Vth2 as the reference denotes a range between a value (upper limit value) obtained by adding a predetermined detection error to the threshold value Vth2 and a value (lower limit value) obtained by subtracting the predetermined detection error from the threshold value Vth2.

The threshold value Vth2 is a threshold value (the voltage value Vc) for determining whether or not the system main relay SMR-B has been locked, and can be pre-set. When the system main relay SMR-B is locked and is ON, the discharge current of the battery pack 10 flows in the current path L2 shown in FIG. 3, and hence the threshold value Vth2 is set in consideration of the resistance value of the resistance element RL. Since the voltage value Vc of the capacitor C11 is dependent on the voltage value Vb of the battery pack 10, it is possible to change the threshold value Vth2 in accordance with the voltage value Vb.

Specifically, as shown in FIG. 6, when the correspondence (the map or the arithmetic expression) between the threshold value (the voltage value Vc) Vth2 and the voltage value Vb is prepared in advance, by detecting the voltage value Vb, it is possible to determine the threshold value Vth2 corresponding to the voltage value Vb. Note that there are cases where the voltage value Vc of the capacitor C11 is less likely to change even when the voltage value Vb changes. In these cases, it is not necessary to change the threshold value Vth2 in accordance with the voltage value Vb, and it is possible to set the fixed value as the threshold value Vth2.

As described above, the resistance value of the resistance element RL is higher than the resistance value of the resistance element RB when it is determined that the leakage of the battery pack 10 has occurred. Accordingly, the voltage value Vc of the capacitor C11 when the system main relay SMR-B has been locked is lower than the voltage value Vc of the capacitor C11 when it is determined that the leakage of the battery pack 10 has occurred. Consequently, as shown in FIG. 6, the threshold value Vth2 is lower than the threshold value Vth1.

When the voltage value Vc is equal to the threshold value Vth2 in the process in step S107, in step S108, the controller 50 determines that the system main relay SMR-B has been locked. At this point, the controller 50 can set, e.g., a flag related to the occurrence of the locking (locking flag).

When the leakage of the battery pack 10 is not present, the locking of the system main relay SMR-B is not present, and the system main relay SMR-B is OFF, the voltage value Vc of the capacitor C11 indicates a voltage value (corresponds to a first voltage value of the invention) $Vc_{13}$_n at the time of a normal state shown in FIG. 6. When the leakage of the battery pack 10 is not present and the system main relay SMR-B is OFF, the discharge current of the battery pack 10 becomes less likely to flow to the capacitor C11, and the voltage value Vc of the capacitor C11 becomes less likely to increase. Accordingly, as shown in FIG. 6, the voltage value Vc_n at the time of the normal state is lower than the threshold value Vth2.

When the voltage value Vc is equal to the voltage value Vc_n, in the process in step S107, the controller 50 determines that the voltage value Vc and the threshold value Vth2 are different from each other. At this point, the controller 50 determines that the locking of the system main relay SMR-B is not present, and ends the process shown in FIG. 5. Herein, since the voltage value Vc of the capacitor C11 is dependent on the voltage value Vb, the voltage value Vc_n at the time of the normal state changes in accordance with the voltage value Vb.

When the leakage flag is set in the process in step S106, it is possible to, e.g., give an alarm to a user. As means for the alarm, it is possible to use sound or display.

In addition, even when the leakage flag is set, the controller 50 can, e.g., prevent the system main relays SMR-B and SMR-G from being turned ON.

On the other hand, when the locking flag is set in the process in step S108, it is possible to, e.g., give the alarm to the user. In addition, when the system main relay SMR-G is not locked, the controller 50 can prevent the system main relay SMR-G from being turned ON. When the system main relays SMR-B and SMR-G are locked, the controller 50 can prevent charge/discharge of the battery pack 10 by preventing the operation of the load 20.

According to the embodiment, by using the first leakage detection circuit 30 or the second leakage detection circuit 40, it is possible to determine whether or not the leakage of the battery pack 10 has occurred. In addition, when the leakage of the battery pack 10 is not present, by focusing attention on a difference in resistance value between the resistance elements RB and RL, it is possible to determine whether or not the system main relay SMR-B or the system main relay SMR-G has been locked by using the first leakage detection circuit 30 or the second leakage detection circuit 40.

Herein, as shown in FIG. 2, in the configuration in which one coil 63 is switched between the energization and the de-energization, the movable contacts MC of the system main relays SMR-B and SMR-G operate at the same time. Herein, by detecting the value of the voltage supplied to the load 20 from the battery pack 10, it is possible to determine whether or not both of the system main relays SMR-B and SMR-G are locked. That is, in the case where the detected voltage value indicates the voltage value Vb of the battery pack 10, it can be determined that that both of the system main relays SMR-B and SMR-G are locked.

However, in such a method, it is not possible to determine whether or not one of the system main relays SMR-B and SMR-G is locked. According to the embodiment, by using the first leakage detection circuit 30, it is possible to determine whether or not the system main relay SMR-B has been locked. In addition, by using the second leakage detection circuit 40, it is possible to determine whether or not the system main relay SMR-G has been locked. Thus, by using the first leakage detection circuit 30 or the second leakage detection circuit 40, it is possible to determine whether or not each of the system main relays SMR-B and SMR-G has been locked.

A second embodiment of the invention will be described. In the embodiment, the same components as those described in the first embodiment are designated by the same reference numerals and the detailed description thereof will be omitted. Hereinafter, points different from the first embodiment will be mainly described.

In the first embodiment, when the leakage of the battery pack 10 occurs, the current value when the current flows in the current path L1 shown in FIG. 3 or the current path L3 shown in FIG. 4 increases. With this, the voltage values Vc of the capacitors C11 and C21 become more likely to increase, and hence it is necessary to increase the capacitances of the capacitors C11 and C21. In the case where the capacitances of the capacitors C11 and C21 are set to large capacitances, it is possible to determine whether or not the leakage of the battery pack 10 has occurred based on the voltage values Vc of the capacitors C11 and C21 while distinguishing between the threshold values Vth1 and Vth2 shown in FIG. 6.

However, when the capacitances of the capacitors C11 and C21 are increased, as will be described below, there are cases where it becomes difficult to distinguish between the threshold value Vth2 and the voltage value Vc_n at the time of the normal state shown in FIG. 6.

Even when a predetermined amount of the charge is accumulated in each of the capacitors C11 and C21, the behavior (increase amount) of the voltage value Vc of each of the capacitors C11 and C21 changes in accordance with the capacitance of each of the capacitors C11 and C21. Specifically, as the capacitance of each of the capacitors C11 and C21 is larger, the increase amount of the voltage value Vc is smaller. As shown in FIG. 6, since the threshold value Vth2 and the voltage value Vc_n are lower than the threshold value Vth1, when the capacitance of each of the capacitors C11 and C21 is increased, there are cases where it becomes difficult to distinguish between the threshold value Vth2 and the voltage value Vc_n. In these cases, it becomes difficult to determine whether or not each of the system main relays SMR-B and SMR-G has been locked based on the voltage value Vc.

In consideration of this point, in the embodiment, different capacitors are used such that the capacitor used when it is determined whether or not the leakage of the battery pack 10 has occurred is different from the capacitor used when it is determined whether or not each of the system main relays SMR-B and SMR-G has been locked. That is, in the embodiment, the configuration of the first leakage detection circuit 30 and the configuration of the second leakage detection circuit 40 are changed from those in the first embodiment.

The configuration of the first leakage detection circuit 30 in the embodiment will be described by using FIG. 7. A switch element (corresponds to a first switch element of the invention) SW11 is provided between the switch element SW10 and the capacitor (corresponds to a first capacitor of the invention) C11. To the switch element SW11 and the capacitor C11, a switch element (corresponds to a second switch element of the invention) SW12 and a capacitor (corresponds to a second capacitor of the invention) C12 are electrically connected in parallel. The switch element SW12 and the capacitor C12 are electrically connected in series to each other. The switch element SWR1 and the resistance element R1 are electrically connected in parallel to the switch element SW11 and the capacitor C11, and are electrically connected in parallel to the switch element SW12 and the capacitor C12.

The capacitor C11 is used when it is determined whether or not the leakage of the battery pack 10 has occurred. The capacitor C12 is used when it is determined whether or not the system main relay SMR-B has been locked. The capacitance of the capacitor C12 is smaller than the capacitance of the capacitor C11.

The configuration of the second leakage detection circuit 40 in the embodiment will be described by using FIG. 8. A switch element (corresponds to the first switch element of the invention) SW21 is provided between the switch element SW20 and the capacitor (corresponds to the first capacitor of the invention) C21. To the switch element SW21 and the capacitor C21, a switch element (corresponds to the second switch element of the invention) SW22 and a capacitor (corresponds to the second capacitor of the invention) C22 are electrically connected in parallel. The switch element SW22 and the capacitor C22 are electrically connected in series to each other. The switch element SWR2 and the resistance element R2 are electrically connected in parallel to the switch element SW21 and the capacitor C21, and are electrically connected in parallel to the switch element SW22 and the capacitor C22.

The capacitor (corresponds to the first capacitor of the invention) C21 is used when it is determined whether or not the leakage of the battery pack 10 has occurred. The capacitor (corresponds to the second capacitor of the invention) C22 is used when it is determined whether or not the system main relay SMR-G has been locked. The capacitance of the capacitor C22 is smaller than the capacitance of the capacitor C21.

Next, a process of determining whether or not the leakage of the battery pack 10 has occurred by using the first leakage detection circuit 30 shown in FIG. 7 will be described by using a flowchart shown in FIG. 9. The process shown in FIG. 9 is executed by the controller 50.

Figure 7:
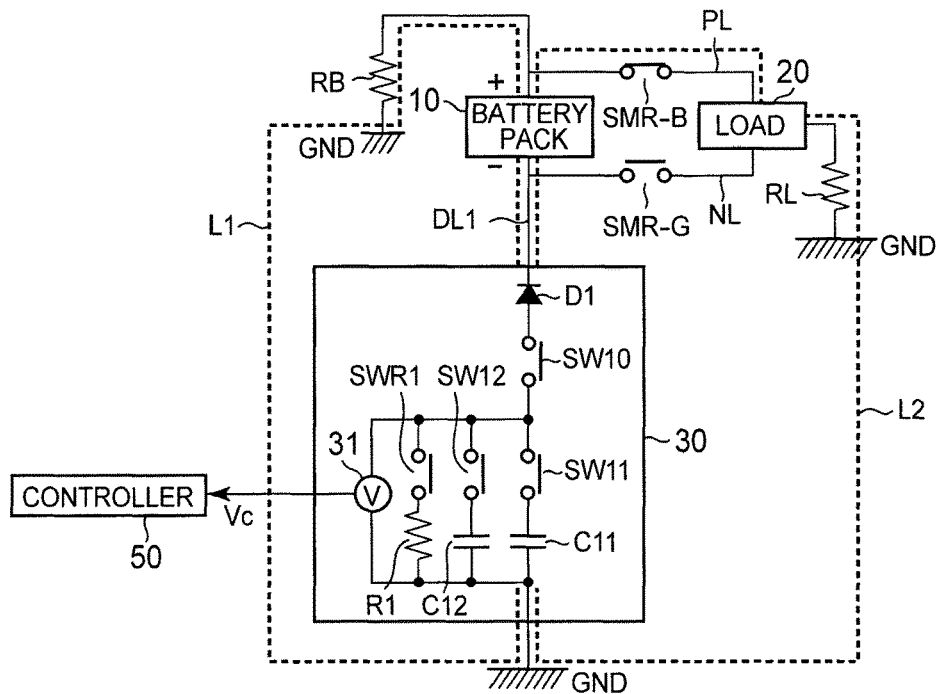
FIG. 7 is a view for explaining the path in which the discharge current of the battery pack flows to the first leakage detection circuit in a second embodiment.
Figure 8:
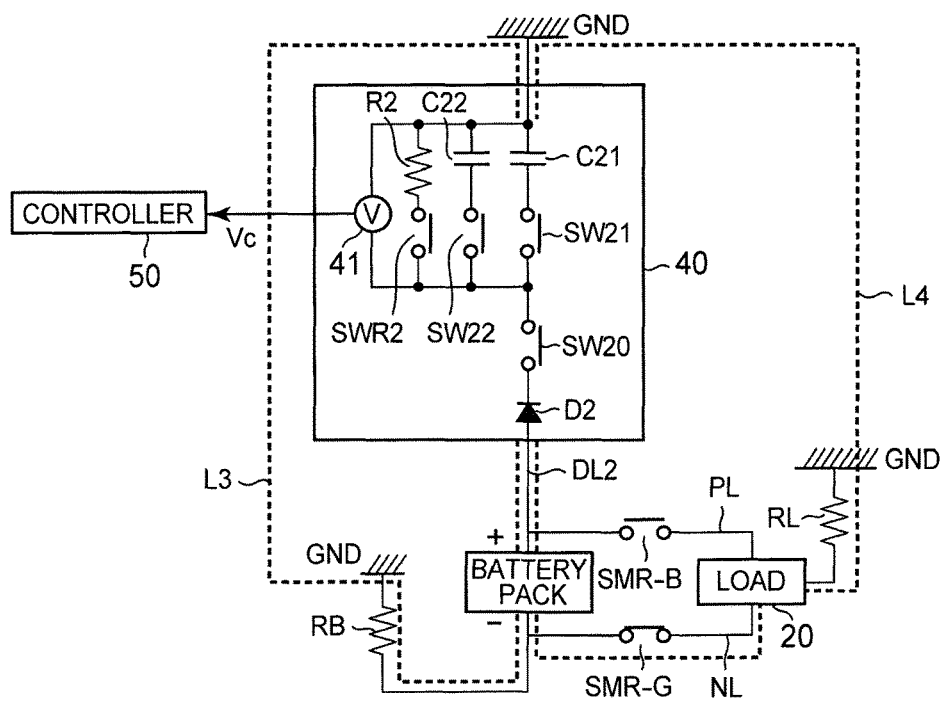
FIG. 8 is a view for explaining the path in which the discharge current of the battery pack flows to the second leakage detection circuit in the second embodiment.
Figure 9:
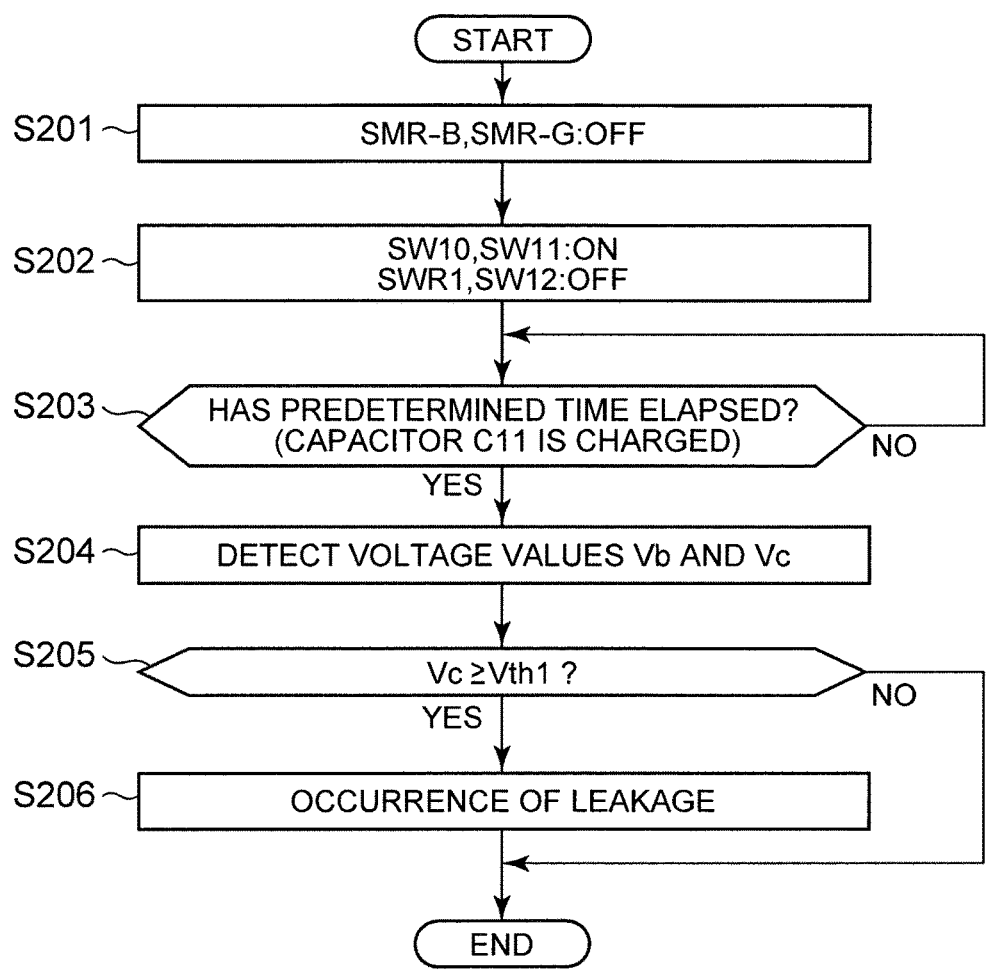
FIG. 9 is a flowchart showing a process of determining the leakage of the battery pack in the second embodiment.

Note that the process shown in FIG. 9 is the process that uses the first leakage detection circuit 30 shown in FIG. 7, but the similar process can also be performed by using the second leakage detection circuit 40 shown in FIG. 8. Consequently, the detailed description of the process that uses the second leakage detection circuit 40 will be omitted. When the process similar to the process shown in FIG. 9 is performed by using the second leakage detection circuit 40, the switch elements SW20, SW21, SW22, and SWR2 are used instead of the switch elements SW10, SW11, SW12, and SWR1. In addition, the voltage value Vc is detected by the voltage sensor 41. Further, as the threshold value Vth1 described later, the voltage value Vc corresponding to the capacitance of the capacitor C21 is set.

In step S201, the controller 50 turns OFF the system main relays SMR-B and SMR-G Note that, when the system main relays SMR-B and SMR-G can be operated individually, it may be only necessary to turn OFF the system main relay SMR-B.

In step S202, the controller 50 turns ON the switch elements SW10 and SW11, and turns OFF the switch elements SWR1 and SW12. With this, the discharge current of the battery pack 10 flows to the capacitor C11 via the current path L1 or the current path L2 shown in FIG. 7, and the capacitor C11 is charged. The processes from step S203 to step S206 are the same as the processes from step S103 to step S106 described in connection with FIG. 5. In the process in step S205, when the voltage value Vc is lower than the threshold value Vth1, the controller 50 determines that the leakage of the battery pack 10 is not present, and ends the process shown in FIG. 9.

After the capacitor C11 is charged, by turning OFF the switch elements SW10 and SW12 and turning ON the switch elements SW11 and SWR1, it is possible to discharge the capacitor C11 via the resistance element R1. With this, it is possible to set the voltage value Vc of the capacitor C11 to 0 [V] and repeat the process shown in FIG. 9.

Figure 10:
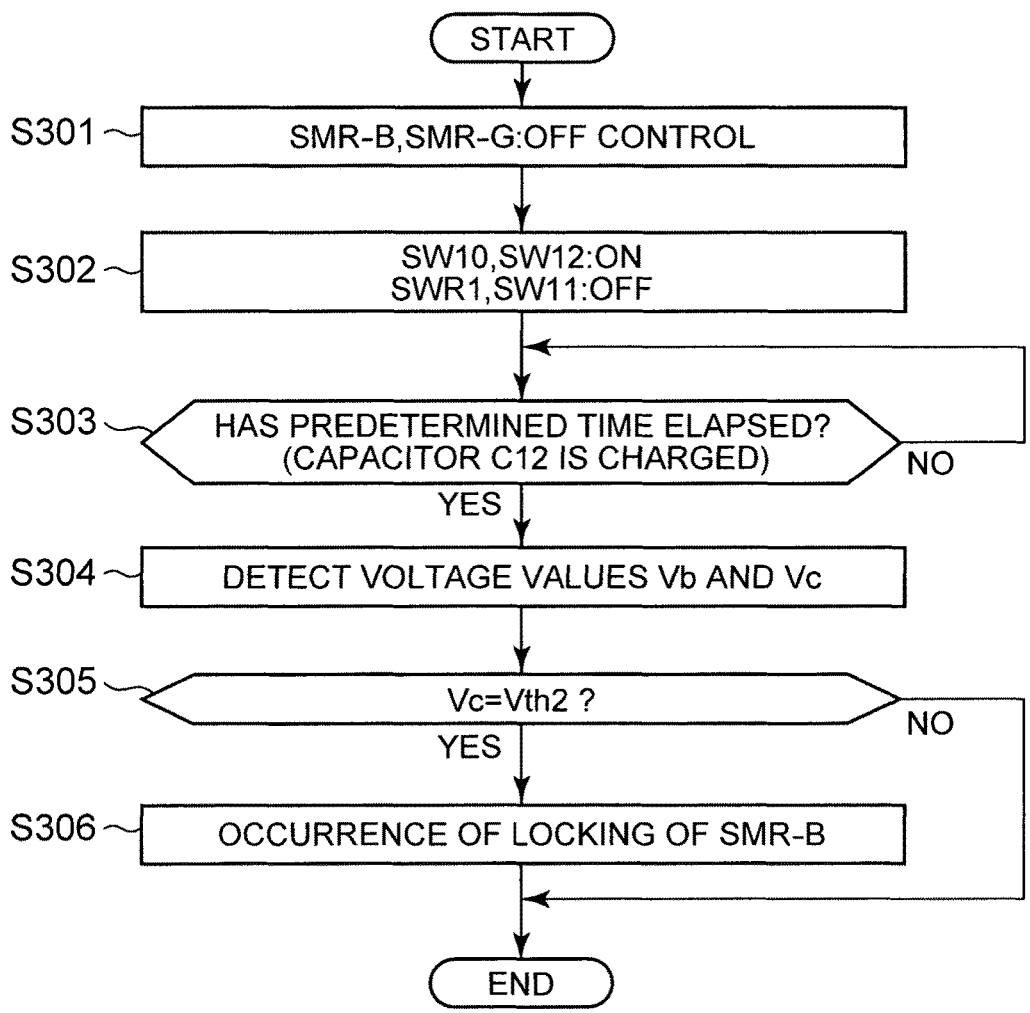
FIG. 10 is a flowchart showing a process of determining the locking of the system main relay in the second embodiment.

Next, a process of determining whether or not the system main relay SMR-B has been locked by using the first leakage detection circuit 30 shown in FIG. 7 will be described by using a flowchart shown in FIG. 10. The process shown in FIG. 10 is executed by the controller 50. After it is determined that the leakage of the battery pack 10 is not present by the process shown in FIG. 9, it is possible to perform the process shown in FIG. 10.

Note that the process shown in FIG. 10 is the process that uses the first leakage detection circuit 30 shown in FIG. 7, but the similar process can be performed by using the second leakage detection circuit 40 shown in FIG. 8. Consequently, the detailed description of the process that uses the second leakage detection circuit 40 will be omitted. Herein, when the second leakage detection circuit 40 is used, it is possible to determine whether or not the system main relay SMR-G has been locked.

When the process similar to the process shown in FIG. 10 is performed by using the second leakage detection circuit 40, the switch elements SW20, SW21, SW22, and SWR2 are used instead of the switch elements SW10, SW11, SW12, and SWR1. In addition, the voltage value Vc is detected by the voltage sensor 41. Further, as the threshold value Vth2 described later, the voltage value Vc corresponding to the capacitance of the capacitor C22 is set.

In step S301, the controller 50 outputs the control signal for turning OFF the system main relays SMR-B and SMR-G Note that, when the system main relays SMR-B and SMR-G can be operated individually, it may be only necessary to output the control signal for turning OFF the system main relay SMR-B.

In step S302, the controller 50 turns ON the switch elements SW10 and SW12, and turns OFF the switch elements SWR1 and SW11. With this, the discharge current of the battery pack 10 flows to the capacitor C12 via the current path L1 or the current path L2 shown in FIG. 7, and the capacitor C12 is charged.

In step S303, the controller 50 stands by until predetermined time elapses from the end of the process in step S302. When the predetermined time has elapsed, in step S304, the controller 50 detects the voltage value Vb by using the voltage sensor 21, and also detects the voltage value Vc of the capacitor C12 by using the voltage sensor 31.

In step S305, the controller 50 determines whether or not the voltage value Vc detected in the process in step S304 is equal to the threshold value Vth2. The process in step S305 is the same as the process in step S107 shown in FIG. 5. Herein, since the capacitance of the capacitor C12 is smaller than the capacitance of the capacitor C11, the threshold value Vth2 used in the process in step S305 and the threshold value Vth2 used in the process in step S107 are different from each other. That is, the threshold value Vth2 used in the process in step S305 is higher than the threshold value Vth2 used in the process in step S107 correspondingly to the reduction in the capacitance of the capacitor C12.

When the voltage value Vc is equal to the threshold value Vth2 in the process in step S305, in step S306, the controller 50 determines that the system main relay SMR-B has been locked. The process in step S306 is the same as the process in step S108 shown in FIG. 5. On the other hand, when the leakage of the battery pack 10 is not present and the locking of the system main relay SMR-B is not present, the voltage value Vc indicates the voltage value Vc_n at the time of the normal state. As described by using FIG. 6, since the voltage value Vc_n at the time of the normal state is lower than the threshold value Vth2, in the process in step S305, it is determined that the voltage value Vc is different from the threshold value Vth2. In this case, the controller 50 determines that the locking of the system main relay SMR-B is not present, and ends the process shown in FIG. 10.

After the capacitor C12 is charged, by turning OFF the switch elements SW10 and SW11 and turning ON the switch elements SW12 and SWR1, it is possible to discharge the capacitor C12 via the resistance element R1. With this, it is possible to set the voltage value Vc of the capacitor C12 to 0 [V] and repeat the process shown in FIG. 10.

According to the embodiment, by appropriately using the capacitor C11 or C12 as the situation demands in the first leakage detection circuit 30, it is possible to facilitate the determination of the occurrence of the leakage of the battery pack 10 and the determination of the occurrence of the locking of the system main relay SMR-B. Also in the second leakage detection circuit 40, it is possible to obtain the same effect as that in the first leakage detection circuit 30.

A third embodiment of the invention will be described. In the embodiment, the same components as those described in the first and second embodiments are designated by the same reference numerals, and the detailed description thereof will be omitted. Hereinafter, points different from the second embodiment will be mainly described.

In the second embodiment, the capacitor C11 or C12 is appropriately used as the situation demands when it is determined whether or not the leakage of the battery pack 10 or the locking of the system main relay SMR-B has occurred by using the first leakage detection circuit 30. In addition, the capacitor C21 or C22 is appropriately used as the situation demands when it is determined whether or not the leakage of the battery pack 10 or the locking of the system main relay SMR-G has occurred by using the second leakage detection circuit 40. Herein, in order to appropriately use the capacitor C11 or C12 as the situation demands, the switch elements SW11 and SW12 need to operate normally. In addition, in order to appropriately use the capacitor C21 or C22 as the situation demands, the switch elements SW21 and SW22 need to operate normally.

In the embodiment, it is determined whether or not the switch elements SW11 and SW12 operate normally, i.e., whether or not the switch elements SW11 and SW12 are faulty. In addition, in the embodiment, it is determined whether or not the switch elements SW21 and SW22 operate normally, i.e., whether or not the switch elements SW21 and SW22 are faulty. The fault of each of the switch elements SW11, SW12, SW21, and SW22 includes a fault in which the switch element is not switched from ON to OFF and is kept ON (referred to as an ON fault) and a fault in which the switch element is not switched from OFF to ON and is kept OFF (referred to as an OFF fault).

Figure 11:
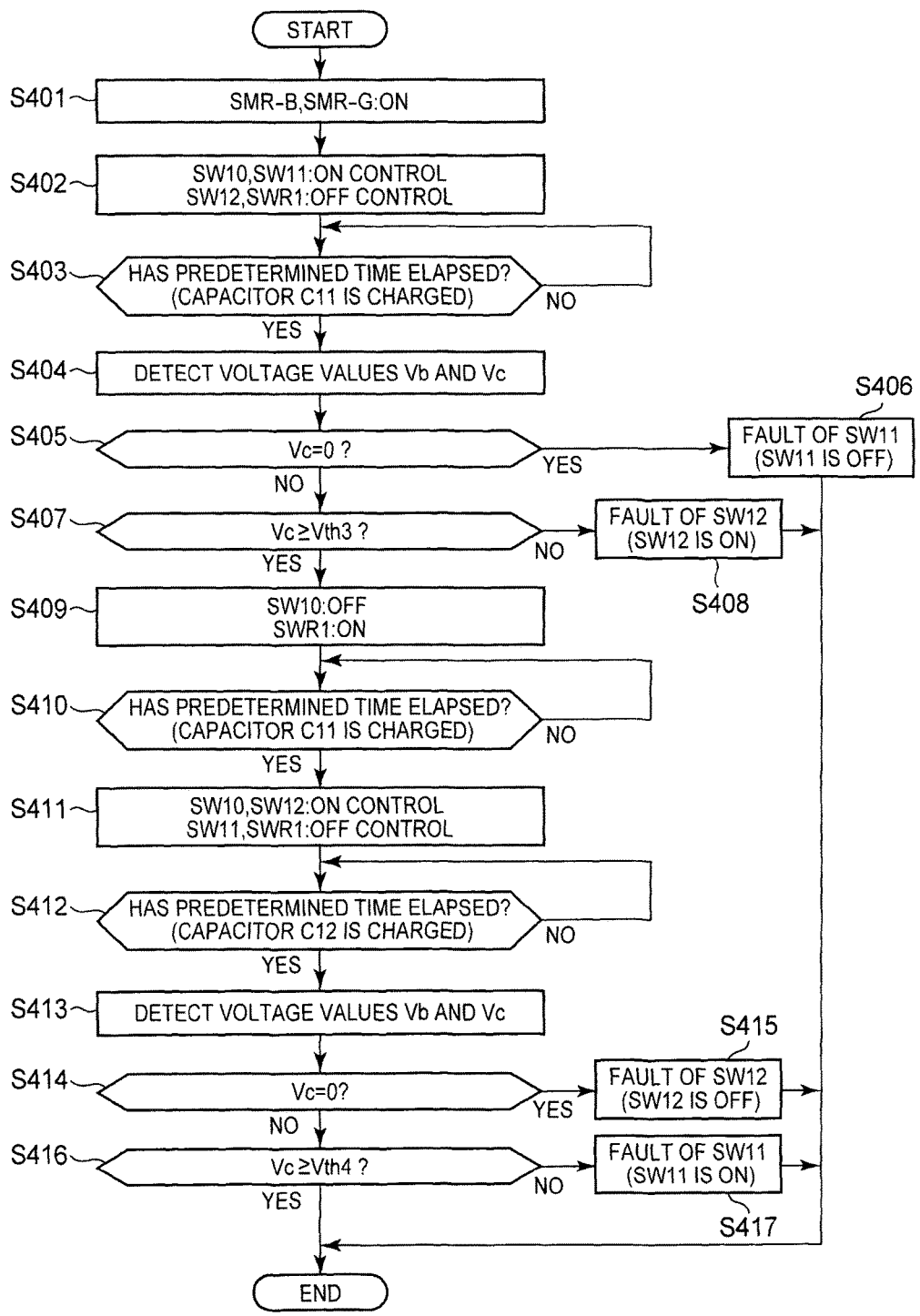
FIG. 11 is a flowchart showing a process of determining a fault of a switch element included in the first leakage detection circuit in a third embodiment.

A process of determining the fault of each of the switch elements SW11 and SW12 included in the first leakage detection circuit 30 will be described by using a flowchart shown in FIG. 11. The process shown in FIG. 11 is executed by the controller 50. Note that, in the embodiment, the process of determining the fault of each of the switch elements SW11 and SW12 will be described, and it is also possible to perform the similar process when the fault of each of the switch elements SW21 and SW22 included in the second leakage detection circuit 40 is determined. Consequently, the detailed description of the process of determining the fault of each of the switch elements SW21 and SW22 will be omitted.

When the process similar to the process shown in FIG. 11 is performed by using the second leakage detection circuit 40, the switch elements SW20, SW21, SW22, and SWR2 are used instead of the switch elements SW10, SW11, SW12, and SWR1. In addition, the voltage value Vc is detected by the voltage sensor 41. Further, as threshold values Vth3 and Vth4 described later, the voltage values Vc corresponding to the capacitances of the capacitors C21 and C22 are set.

In step S401, the controller 50 turns ON the system main relays SMR-B and SMR-G. Note that, when the system main relays SMR-B and SMR-G can be operated individually, it may be only necessary to turn ON the system main relay SMR-B.

In step S402, the controller 50 outputs the control signal for turning ON the switch elements SW10 and SW11, and the control signal for turning OFF the switch elements SW12 and SWR1. In step S403, the controller 50 stands by until predetermined time elapses from the end of the process in step S402. Herein, since the system main relay SMR-B is ON, when the switch elements SW10 and SW11 are turned ON, the current flows in the current path L2 shown in FIG. 7, and the capacitor C11 is thereby charged.

When the predetermined time has elapsed in the process in step S403, in step S404, the controller 50 detects the voltage value Vb by using the voltage sensor 21, and also detects the voltage value Vc by using the voltage sensor 31. In step S405, the controller 50 determines whether or not the voltage value Vc detected in the process in step S404 is 0 [V]. In the process in step S405, in consideration of the detection error of the voltage sensor 31, it is also possible to determine whether or not the voltage value Vc falls within the range of the detection error having 0 [V] as the reference. That is, it is possible to determine whether or not the voltage value Vc is substantially 0 [V].

When the voltage value Vc is 0 [V], in step S406, the controller 50 determines that the switch element SW11 has the OFF fault. When the capacitor C11 is not charged and the voltage value Vc is 0 [V] in spite of the fact that the control signal for turning ON the switch element SW11 is outputted in the process in step S402, it can be determined that the switch element SW11 has the OFF fault. In the process in step S406, it is possible to set, e.g., a flag indicative of the fault of the switch element SW11 (fault flag). When the process in step S406 has been performed, the controller 50 ends the process shown in FIG. 11.

When the voltage value Vc is not 0 [V], the controller 50 determines that the switch element SW11 does not have the OFF fault. Subsequently, in step S407, the controller 50 determines whether or not the voltage value Vc detected in the process in step S404 is not less than the threshold value Vth3. The threshold value Vth3 is the voltage value Vc when the capacitor C11 is charged with the current flowing in the current path L2. That is, the threshold value Vth3 corresponds to the threshold value Vth2 shown in FIG. 6.

Herein, depending on the detection error of the voltage sensor 31, there are cases where the voltage value Vc becomes lower than the threshold value Vth2. In consideration of this point, it is possible to set a value lower than the threshold value Vth2 as the threshold value Vth3. Since the voltage value Vc of the capacitor C11 is dependent on the voltage value Vb, when the correspondence (the map or the arithmetic expression) between the threshold value (the voltage value Vc) Vth3 and the voltage value Vb is prepared in advance, by detecting the voltage value Vb, it is possible to determine the threshold value Vth3 corresponding to the voltage value Vb.

When the voltage value Vc is lower than the threshold value Vth3 in the process in step S407, in step S408, the controller 50 determines that the switch element SW12 has the ON fault According to the process in step S402, control for turning ON only the switch elements SW10 and SW11 is performed. When only the switch elements SW10 and SW11 are turned ON according to the control of the controller 50, the capacitor C11 is charged with the current flowing in the current path L2, and the voltage value Vc of the capacitor C11 thereby becomes not less than the threshold value Vth3.

However, when not only the switch element SW11 but also switch element SW12 is ON, the capacitors C11 and C12 are charged, and a part of the charge to be accumulated in the capacitor C11 is accumulated in the capacitor C12. With this, the voltage value Vc of the capacitor C11 does not increase up to the threshold value Vth3, and the voltage value Vc detected by the voltage sensor 31 becomes lower than the threshold value Vth3. When the voltage value Vc is lower than the threshold value Vth3, it can be determined that the switch element SW12 has the ON fault In the process in step S408, it is possible to set, e.g., the flag indicative of the fault of the switch element SW12 (fault flag). When the process in step S408 has been performed, the controller 50 ends the process shown in FIG. 11.

When the voltage value Vc is not less than the threshold value Vth3 in the process in step S407, the controller 50 determines that the switch element SW12 does not have the ON fault. Subsequently, in step S409, the controller 50 turns OFF the switch element SW10, and turns ON the switch element SWR1. With this, it is possible to discharge the capacitor C11 via the resistance element R1.

In step S410, the controller 50 stands by until predetermined time elapses from the end of the process in step S409. In the process in step S410, the capacitor C11 is discharged such that the voltage value Vc of the capacitor C11 becomes 0 [V]. It is possible to pre-set the predetermined time in consideration of this point.

When the predetermined time has elapsed in the process in step S410, in step S411, the controller 50 outputs the control signal for turning ON the switch elements SW10 and SW12, and the control signal for turning OFF the switch elements SW11 and SWR1. In step S412, the controller 50 stands by until predetermined time elapses from the end of the process in step S411. Herein, since the system main relay SMR-B is turned ON by the process in step S410, when the switch elements SW10 and SW12 are ON, the capacitor C12 is charged with the current flowing in the current path L2 shown in FIG. 7.

When the predetermined time has elapsed in the process in step S412, in step S413, the controller 50 detects the voltage value Vb by using the voltage sensor 21, and also detects the voltage value Vc by using the voltage sensor 31. In step S414, the controller 50 determines whether or not the voltage value Vc detected in the process in step S413 is 0 [V]. Herein, in consideration of the detection error of the voltage sensor 31, it may be determined whether or not the voltage value Vc falls within the range of the detection error having 0 [V] as the reference. That is, it is possible to determine whether or not the voltage value Vc is substantially 0 [V].

When the voltage value Vc is 0 [V], in step S415, the controller 50 determines that the switch element SW12 has the OFF fault. When the capacitor C12 is not charged and the voltage value Vc is 0 [V] in spite of the fact that the switch element SW12 is controlled to be ON by the process in step S411, it can be determined that the switch element SW12 has the OFF fault. In the process in step S415, it is possible to set, e.g., the flag indicative of the fault of the switch element SW12 (fault flag). When the process in step S415 has been performed, the controller 50 ends the process shown in FIG. 11.

When the voltage value Vc is not 0 [V] in the process in step S414, the controller 50 determines that the switch element SW12 does not have the OFF fault. Subsequently, the controller 50 determines whether or not the voltage value Vc detected in the process in step S413 is not less than the threshold value Vth4.

The threshold value Vth4 is the voltage value Vc when the capacitor C12 is charged with the current flowing in the current path L2. Specifically, the threshold value Vth4 corresponds to the threshold value Vth2 shown in FIG. 6. However, the threshold value Vth4 is the voltage value Vc of the capacitor C12 having the capacitance smaller than the capacitance of the capacitor C11, and hence the threshold value Vth4 is higher than the threshold value Vth2. Herein, depending on the detection error of the voltage sensor 31, there are cases where the voltage value Vc becomes lower than the voltage value Vc corresponding to the threshold value Vth2. In consideration of this point, it is possible to set a value lower than the voltage value corresponding to the threshold value Vth2 as the threshold value Vth4.

Since the voltage value Vc of the capacitor C12 is dependent on the voltage value Vb, when the correspondence (the map or the arithmetic expression) between the threshold value (the voltage value Vc) Vth4 and the voltage value Vb is prepared in advance, by detecting the voltage value Vb, it is possible to determine the threshold value Vth4 corresponding to the voltage value Vb.

When the voltage value Vc is lower than the threshold value Vth4 in the process in step S416, in step S417, the controller 50 determines that the switch element SW11 has the ON fault. According to the process in step S411, control for turning ON only the switch elements SW10 and SW12 is performed. When only the switch elements SW10 and SW12 are turned ON according to the control of the controller 50, the capacitor C12 is charged with the current flowing in the current path L2, and the voltage value Vc of the capacitor C12 thereby becomes not less than the threshold value Vth4.

However, when not only the switch element SW12 but also the switch element SW11 is ON, the capacitors C11 and C12 are charged and a part of the charge to be accumulated in the capacitor C12 is accumulated in the capacitor C11. With this, the voltage value Vc of the capacitor C12 does not increase up to the threshold value Vth4, and the voltage value Vc detected by the voltage sensor 31 becomes lower than the threshold value Vth4. When the voltage value Vc is lower than the threshold value Vth4, it can be determined that the switch element SW11 has the ON fault In the process in step S417, it is possible to set, e.g., the flag indicative of the fault of the switch element SW11 (fault flag). When the process in step S417 has been performed, the controller 50 ends the process shown in FIG. 11.

When the voltage value Vc is not less than the threshold value Vth4 in the process in step S416, the controller 50 can determine that the switch element SW11 does not have the ON fault. Subsequently, the controller 50 ends the process shown in FIG. 11.

According to the embodiment, by monitoring the voltage value Vc while performing the control for switching the switch elements SW11 and SW12 between ON and OFF, it is possible to determine the fault (the ON fault or the OFF fault) of each of the switch elements SW11 and SW12.

When the switch elements SW11 and SW12 are faulty, even in the case where the process shown in FIG. 9 or 10 are performed, wrong determinations are made. To cope with this, when it is determined that the switch elements SW11 and SW12 are faulty, it is possible to prevent the execution of the process shown in FIG. 9 or 10. When the fault flag is set in the process shown in FIG. 11, as described in the first embodiment, for example, it is possible to give the alarm to the user.

Note that the order of determination of the fault of each of the switch elements SW11 and SW12 is not limited to the order shown in the process in FIG. 11. For example, it is possible to perform the processes from step S402 to step S408 after the processes from step S411 to step S417 are performed. In addition, it is possible to perform the process in step S407 before the process in step S405, and it is possible to perform the process in step S416 before the process in step S414.

In addition, in the process shown in FIG. 11, the system main relays SMR-B and SMR-G are turned ON in the process in step S401, but the invention is not limited thereto. Specifically, it is possible to perform the processes in and after step S402 in a state in which the system main relays SMR-B and SMR-G are OFF.

In this case, as the threshold value Vth3 used in the process in step S407, it is possible to use the voltage value Vc when the capacitor C11 is charged with the current flowing in the current path L1. The threshold value Vth3 at this point corresponds to the threshold value Vth1 shown in FIG. 6. Herein, it is also possible to set a value lower than the threshold value Vth1 as the threshold value Vth3.

In addition, as the threshold value Vth4 used in the process in step S416, it is possible to use the voltage value Vc when the capacitor C12 is charged with the current flowing in the current path L1. The threshold value Vth4 at this point corresponds to the threshold value Vth1 shown in FIG. 6. However, since the capacitance of the capacitor C12 is smaller than the capacitance of the capacitor C11, the threshold value Vth4 is higher than the threshold value Vth1. Herein, it is also possible to set a value lower than the voltage value Vc of the capacitor C12 that corresponds to the threshold value Vth1 as the threshold value Vth4.

The fault of each of the switch elements SW11 and SW12 is determined in the process shown in FIG. 11 and, in addition to this, it is also possible to determine the fault of each of the switch elements SWIG and SWR1. Specifically, based on the voltage value Vc detected by the voltage sensor 31, it is possible to determine the fault of each of the switch elements SWIG and SWR1. Hereinafter, the method (an example) for determining the fault of each of the switch elements SWIG and SWR1 will be briefly described.

When the control for turning ON the normal switch elements SW11 and SW10 is performed after it is determined that the switch element SW11 is not faulty, in the case where the voltage value Vc is 0 [V], it can be determined that the switch element SWIG is faulty in the OFF state. On the other hand, when the control for turning ON the normal switch element SW11 and turning OFF the switch element SW10 are performed after the voltage value Vc of the capacitor C11 is set to 0 [V], in the case where the voltage value Vc is higher than 0 [V], it can be determined that the switch element SW10 is faulty in the ON state.

When the control for turning ON the switch element SWR1 is performed and the capacitor C11 or the capacitor C12 is discharged, in the case where the voltage value Vc is not reduced, it can be determined that the switch element SWR1 is faulty in the OFF state. On the other hand, in the case where the voltage value Vc continues to be reduced in spite of the fact that the control for turning OFF the switch element SWR1 is performed, it can be determined that the switch element SWR1 is faulty in the ON state.

A fourth embodiment of the invention will be described. In the embodiment, the same components as those described in the first to third embodiments are designated by the same reference numerals and the detailed description thereof will be omitted. Hereinafter, points different from the first to third embodiments will be mainly described.

In the first embodiment, there are cases where variations in capacitance occur in the capacitor C11 included in the first leakage detection circuit 30. In addition, in the second embodiment, there are cases where variations in capacitance occur in each of the capacitors C11 and C12 included in the first leakage detection circuit 30. There are cases where variations in capacitance occur in the capacitors C21 and C22 also in the second leakage detection circuit 40. For example, in accordance with individual differences among the capacitors C11, C12, C21, and C22, there are cases where variations in capacitance occur. Further, in accordance with temperature changes of the individual capacitors C11, C12, C21, and C22, there are cases where variations in capacitance occur.

Hereinafter, the case where variations have occurred in the capacitance of the capacitor C11 will be described. Note that the same description applies to the case where variations have occurred in the capacitance of each of the capacitors C12, C21, and C22.

When variations occur in the capacitance of the capacitor C11, variations also occur in the voltage value Vc of the capacitor C11. With this, as shown in FIG. 12, there are cases where the voltage value Vc detected by the voltage sensor 31 when the system main relay SMR-B has been locked is displaced from the threshold value Vth2 within the range of a displacement amount ΔVd1.

Similarly, there are cases where the voltage value Vc detected by the voltage sensor 31 when the leakage of the battery pack 10 and the locking of the system main relay SMR-B are not present is displaced from the voltage value Vc_n at the time of the normal state within the range of a displacement amount ΔVd2. The threshold value Vth2 and the voltage value Vc_n shown in FIG. 12 are the same as the threshold value Vth2 and the voltage value Vc_n shown in FIG. 6. The displacement amounts ΔVd1 and ΔVd2 change according to the individual difference and the temperature of the capacitor C11.

Figure 12:
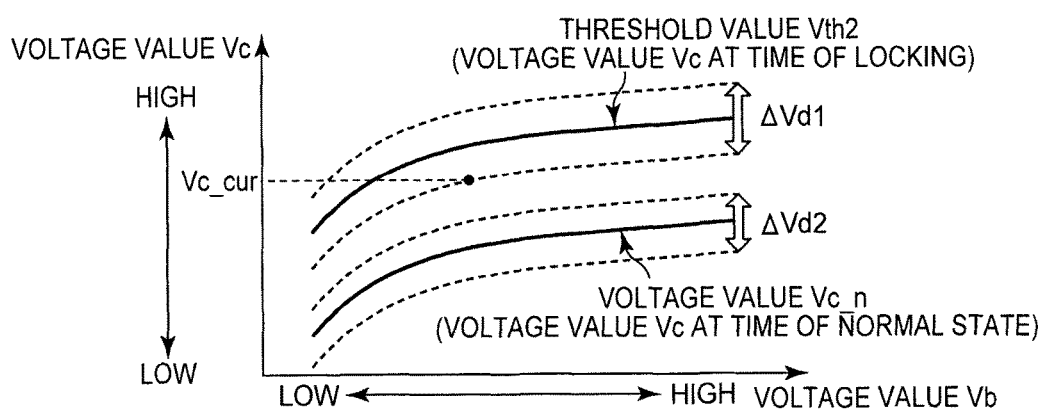
FIG. 12 is a view for explaining that a correspondence between the voltage value of the battery pack and the voltage value of the capacitor is displaced due to variations in the capacitance of the capacitor.

For example, when the voltage value Vc detected by the voltage sensor 31 is a voltage value Vc_cur shown in FIG. 12, the voltage value Vc_cur is apart from the threshold value Vth2 and the voltage value Vc_n at the time of the normal state. Accordingly, even when the voltage value Vc_cur is detected, it is difficult to determine the occurrence of the locking of the system main relay SMR-B.

In the embodiment, even when variations occur in the capacitance of the capacitor C11, it is possible to determine whether or not the system main relay SMR-B has been locked in a state in which variations in capacitance are not considered.

When variations occur in the capacitance of the capacitor C11, the direction of the displacement of the voltage value Vc of the capacitor C11 is the same direction irrespective of the presence or absence of the locking of the system main relay SMR-B. For example, when the voltage value Vc in the case where the system main relay SMR-B has been locked becomes higher than the threshold value Vth2, the voltage value Vc when the locking of the system main relay SMR-B is not present becomes higher than the voltage value Vc_n at the time of the normal state. That is, a curve (a curve shown in FIG. 6) indicative of the correspondence between the threshold value Vth2 and the voltage value Vb and a curve (a curve shown in FIG. 6) indicative of the correspondence between the voltage value Vc_n and the voltage value Vb are offset to the high side of the voltage value Vc by the same amount.

On the other hand, when the voltage value Vc in the case where the main system relay SMR-B has been locked becomes lower than the threshold value Vth2, the voltage value Vc in the case where the locking of the system main relay SMR-B is not present becomes lower than the voltage value Vc_n at the time of the normal state. That is, the curve (the curve shown in FIG. 6) indicative of the correspondence between the threshold value Vth2 and the voltage value Vb and the curve (the curve shown in FIG. 6) indicative of the correspondence between the voltage value Vc_n and the voltage value Vb are offset to the low side of the voltage value Vc by the same amount.

As described above, even when variations occur in the capacitance of the capacitor C11, a difference between the threshold value Vth2 and the voltage value Vc_n does not change at an arbitrary voltage value Vb. Based on this point, even when variations occur in the capacitance of the capacitor C11, it becomes easy to determine whether or not the system main relay SMR-B has been locked.

Specifically, under a condition that the voltage value Vb is unlikely to change, the voltage value Vc when the system main relay SMR-B is controlled to be ON and the voltage value Vc when the system main relay SMR-B is controlled to be OFF are detected. Subsequently, when a difference (voltage difference) ΔVc between these voltage values Vc corresponds to the difference between the threshold value Vth2 and the voltage value Vc_n, it can be seen that the locking of the system main relay SMR-B is not present.

On the other hand, when the system main relay SMR-B has been locked, the voltage value Vc when the system main relay SMR-B is controlled to be OFF becomes equal to the voltage value Vc when the system main relay SMR-B is controlled to be ON. That is, the difference (voltage difference) ΔVc between these voltage values Vc is "0". Subsequently, even in consideration of the detection error of the voltage sensor 31, the voltage difference ΔVc is smaller than the difference between the threshold value Vth2 and the voltage value Vc_n. With this, it can be seen that the system main relay SMR-B has been locked.

Hereinafter, a process of determining whether or not the system main relay SMR-B has been locked by using the first leakage detection circuit 30 shown in FIG. 3 will be described by using a flowchart shown in FIG. 13. The process shown in FIG. 13 is executed by the controller 50.

Note that it is possible to perform a process similar to the process shown in FIG. 13 when the locking of the system main relay SMR-G is determined by using the second leakage detection circuit 40 shown in FIG. 4, and hence the detailed description thereof will be omitted. Herein, when the process similar to the process shown in FIG. 13 is performed by using the second leakage detection circuit 40 shown in FIG. 4, the switch elements SW20 and SWR2 are used instead of the switch elements SW10 and SWR1. In addition, the voltage value Vc is detected by the voltage sensor 41.

In step S501, the controller 50 outputs the control signal for turning ON the system main relays SMR-B and SMR-G Note that, when the system main relays SMR-B and SMR-G can be operated individually, it is also possible to output the control signal for turning ON only the system main relay SMR-B.

In step S502, the controller 50 turns ON the switch element SW10, and turns OFF the switch element SWR1. In step S503, the controller 50 stands by until predetermined time elapses from the end of the process in step S502. Herein, since the switch element SW10 is ON, when the system main relay SMR-B is ON, the current flows in the current path L2 shown in FIG. 3, and the capacitor C11 is charged.

When the predetermined time has elapsed in the process in step S503, in step S504, the controller 50 detects the voltage value Vc (assumed to be a voltage value Vc1) by using the voltage sensor 31, and stores information on the voltage value Vc1 in the memory 51. In step S505, the controller 50 turns OFF the switch element SW10, and turns ON the switch element SWR1. With this, it is possible to discharge the capacitor C11 via the resistance element R1.

In step S506, the controller 50 stands by until predetermined time elapses from the end of the process in step S505. In the process in step S506, the capacitor C11 is discharged such that the voltage value Vc of the capacitor C11 becomes 0 [V]. It is possible to appropriately set the predetermined time in consideration of this point.

When the predetermined time has elapsed in the process in step S506, in step S507, the controller 50 outputs the control signal for turning OFF the system main relays SMR-B and SMR-G Note that, when the control signal for turning ON only the system main relay SMR-B is outputted in the process in step S501, it is possible to output the control signal for turning OFF only the system main relay SMR-B in the process in step S507.

In step S508, the controller 50 turns ON the switch element SW10, and turns OFF the switch element SWR1. In step S509, the controller 50 detects the voltage value Vc (assumed to be a voltage value Vc2) by using the voltage sensor 31, and stores information on the voltage value Vc2 in the memory 51.

In step S510, the controller 50 calculates a voltage difference ΔVc based on the voltage values Vc1 and Vc2 stored in the memory 51 in the processes in step S504 and step S509. Specifically, the voltage difference ΔVc is calculated by subtracting the voltage value Vc2 from the voltage value Vc1. Subsequently, in step S510, the controller 50 determines whether or not the calculated voltage difference ΔVc is smaller than the threshold value ΔVth. As described above, the threshold value ΔVth is the difference between the threshold value Vth2 and the voltage value Vc_n, and can be determined in advance.

In the process in step S510, when the voltage value ΔVc is smaller than the threshold value ΔVth, in step S511, the controller 50 determines that the system main relay SMR-B has been locked. In this case, the controller 50 can set the flag related to the occurrence of the locking (the locking flag described above). On the other hand, when the voltage difference ΔVc is not less than the threshold value ΔVth in the process in step S510, the controller 50 determines that the locking of the system main relay SMR-B is not present, and ends the process shown in FIG. 13.

Although the first leakage detection circuit 30 shown in FIG. 3 is used in the process shown in FIG. 13, it is also possible to perform the process similar to the process shown in FIG. 13 when the first leakage detection circuit 30 shown in FIG. 7 is used or the second leakage detection circuit 40 shown in FIG. 8 is used. When the first leakage detection circuit 30 shown in FIG. 7 is used, the capacitor C12 may be charged. In this case, the voltage value Vc of the capacitor C12 when the system main relay SMR-B is controlled to be ON, and the voltage value Vc of the capacitor C12 when the system main relay SMR-B is controlled to be OFF are detected. Subsequently, by calculating the difference ΔVc between these voltage values Vc and comparing the voltage difference ΔVc with the threshold value ΔVth, it is possible to determine whether or not the system main relay SMR-B has been locked.

When the second leakage detection circuit 40 shown in FIG. 8 is used, the capacitor C22 may be charged. In this case, the voltage value Vc of the capacitor C22 when the system main relay SMR-G is controlled to be ON, and the voltage value Vc of the capacitor C22 when the system main relay SMR-G is controlled to be OFF are detected. Subsequently, by calculating the difference ΔVc between these voltage values Vc and comparing the voltage difference ΔVc with the threshold value ΔVth, it is possible to determine whether or not the system main relay SMR-G has been locked.

According to the embodiment, by calculating the voltage difference ΔVc by using the same capacitor C11, it is possible to determine whether or not the system main relay SMR-B has been locked in a state in which the individual difference of the capacitor C11 is not considered. In addition, by detecting the voltage values Vc1 and Vc2 in a short time period, it is possible to suppress variations in voltage value Vc resulting from the temperature change of the capacitor C11. With this, it is possible to determine whether or not the system main relay SMR-B has been locked in a state in which the temperature change of the capacitor C11 is not considered. Thus, in the embodiment, it is possible to determine whether or not the system main relay SMR-B has been locked in the state in which variations in the capacitance of the capacitor C11 are not considered.

The invention claimed is:

1. An electrical storage system comprising:
an electrical storage device;
a load;
a line configured to connect the electrical storage device and the load;
a relay provided in the line;
a capacitor having one end connected to the electrical storage device and the other end connected to a ground;
a voltage sensor configured to detect a voltage value of the capacitor after the capacitor is charged with current that flows through a current pass;
a first insulation resistor disposed between the electrical storage device and the ground;
a second insulation resistor disposed between the load and the ground;
a first current path including the first insulation resistor;
a second current path including the line and the second insulation resistor; and
a controller configured to
(a) control ON and OFF of the relay, and
(b) determine that the relay is locked in an ON state when the voltage value, in a case where control for turning OFF the relay is performed, is substantially equal to a second predetermined voltage value,
a first resistance value being higher than a second resistance value, the second predetermined voltage value being higher than a first predetermined voltage value, the first resistance value being a resistance value of the first insulation resistor, the second resistance value being a resistance value of the second insulation resistor, the first predetermined voltage value being a voltage value when a discharge current of the electrical storage device flows to the capacitor in the first current path, the second predetermined voltage value being a voltage value when the discharge current of the electrical storage device flows to the capacitor in the second current path.

2. The electrical storage system according to claim 1, wherein
the capacitor includes
a first capacitor, and
a second capacitor connected in parallel to the first capacitor, a capacitance of the second capacitor being smaller than a capacitance of the first capacitor, a first switch element being connected in series to the first capacitor, a second switch element being connected in series to the second capacitor and connected in parallel to the first capacitor and the first switch element, and
the controller is configured to
turn ON the first switch element and turn OFF the second switch element when the controller determines an occurrence of a leakage resulting from a reduction in the first resistance value,
determine that the leakage resulting from the reduction in the first resistance value has occurred when the voltage value detected by the voltage sensor is higher than or equal to a third voltage value, the third voltage value being a value higher than the second predetermined voltage value, and
turn OFF the first switch element and turn ON the second switch element when the controller determines whether the relay is locked.

3. The electrical storage system according to claim 2, wherein
the controller is configured to
(a) determine that the first switch element is faulty in an OFF state when control for turning ON the first switch element is performed and control for turning OFF the second switch element is performed and when the voltage value detected by the voltage sensor is substantially 0, and
(b) determine that the second switch element is faulty in an ON state when the voltage value detected by the voltage sensor is lower than a fourth predetermined voltage value,
the fourth predetermined voltage value is a voltage value when the discharge current of the electrical storage device flows to the first capacitor in the first current path or the second current path.

4. The electrical storage system according to claim 2, wherein
the controller is configured to
(a) determine that the second switch element is faulty in the OFF state when control for turning OFF the first switch element is performed and control for turning ON the second switch element is performed and when the voltage value detected by the voltage sensor is substantially 0, and
(b) determine that the first switch element is faulty in the ON state when the voltage value detected by the voltage sensor is lower than a fifth predetermined voltage value,
the fifth predetermined voltage value is a voltage value when the discharge current of the electrical storage device flows to the second capacitor in the first current path or the second current path.

5. An electrical storage system comprising:
an electrical storage device;

a load;

a line configured to connect the electrical storage device and the load;

a relay provided in the line;

a capacitor having one end connected to the electrical storage device and the other end connected to a ground;

a voltage sensor configured to detect a voltage value of the capacitor after the capacitor is charged with current that flows through a current pass;

a first insulation resistor disposed between the electrical storage device and the ground;

a second insulation resistor disposed between the load and the ground;

a first current path including the first insulation resistor;

a second current path including the line and the second insulation resistor; and a controller configured to
(a) control ON and OFF of the relay, and
(b) determine that the relay is locked in an ON state when a voltage difference in a case where control for switching the relay between ON and OFF is performed is smaller than a difference between a first predetermined voltage value and a second predetermined voltage value, a first resistance value being higher than a second resistance value, the first predetermined voltage value being lower than the second predetermined voltage value, the first resistance value being a resistance value of the first insulation resistor, the second resistance value being a resistance value of the second insulation resistor, the first predetermined voltage value being a voltage value when a discharge current of the electrical storage device flows to the capacitor in the first current path, the second predetermined voltage value being a voltage value when the discharge current of the electrical storage device flows to the capacitor in the second current path, the voltage difference being a voltage difference between the voltage value detected by the voltage sensor when control for turning ON the relay is performed and the voltage value detected by the voltage sensor when control for turning OFF the relay is performed.

6. The electrical storage system according to claim 5 wherein the capacitor includes a first capacitor, and a second capacitor connected in parallel to the first capacitor, a capacitance of the second capacitor being smaller than a capacitance of the first capacitor, a first switch element being connected in series to the first capacitor, a second switch element being connected in series to the second capacitor and connected in parallel to the first capacitor and the first switch element, and the controller is configured to turn ON the first switch element and turn OFF the second switch element when the controller determines an occurrence of a leakage resulting from a reduction in the first resistance value, determine that the leakage resulting from the reduction in the first resistance value has occurred when the voltage value detected by the voltage sensor is higher than or equal to a third voltage value, the third voltage value being a value higher than the second predetermined voltage value, and turn OFF the first switch element and turn ON the second switch element when the controller determines whether the relay is locked.

7. The electrical storage system according to claim 6, wherein the controller is configured to
(a) determine that the first switch element is faulty in an OFF state when control for turning ON the first switch element is performed and control for turning OFF the second switch element is performed and when the voltage value detected by the voltage sensor is substantially 0, and
(b) determine that the second switch element is faulty in an ON state when the voltage value detected by the voltage sensor is lower than a fourth predetermined voltage value, the fourth predetermined voltage value is a voltage value when the discharge current of the electrical storage device flows to the first capacitor in the first current path or the second current path.

8. The electrical storage system according to claim 6, wherein the controller is configured to
(a) determine that the second switch element is faulty in the OFF state when control for turning OFF the first switch element is performed and control for turning ON the second switch element is performed and when the voltage value detected by the voltage sensor is substantially 0, and
(b) determine that the first switch element is faulty in the ON state when the voltage value detected by the voltage sensor is lower than a fifth predetermined voltage value, the fifth predetermined voltage value is a voltage value when the discharge current of the electrical storage device flows to the second capacitor in the first current path or the second current path.

9. An electrical storage system comprising:

an electrical storage device;

a load;

a line configured to connect the electrical storage device and the load;

a relay provided in the line;

a capacitor having one end connected to the electrical storage device and the other end connected to a ground;

a voltage sensor configured to detect a voltage value of the capacitor after the capacitor is charged with current that flows through a current pass;

a first insulation resistor disposed between the electrical storage device and the ground;

a second insulation resistor disposed between the load and the ground and having a resistance value different from a resistance value of the first insulation resistor;

a first current path including the first insulation resistor;

a second current path including the line and the second insulation resistor; and a controller configured to determine that the relay is locked in an ON state when a voltage value in a case where a signal for turning OFF the relay is outputted is substantially equal to a predetermined voltage value, the predetermined voltage value being a voltage value of the capacitor detected by the voltage sensor when a discharge current of the electrical storage device flows to the capacitor in the second current path.

10. An electrical storage system comprising:

an electrical storage device;

a load;

a line configured to connect the electrical storage device and the load;

a relay provided in the line;
a capacitor having one end connected to the electrical storage device and the other end connected to a ground;
a voltage sensor configured to detect a voltage value of the capacitor after the capacitor is charged with current that flows through a current pass;
a first insulation resistor disposed between the electrical storage device and the ground;
a second insulation resistor disposed between the load and the ground;
a first current path including the first insulation resistor;
a second current path including the line and the second insulation resistor; and
a controller configured to
    determine that the relay is locked in an ON state when a predetermined voltage difference in a case where a signal for switching the relay between ON and OFF is outputted is smaller than a difference between a first predetermined voltage value and a second predetermined voltage value,
the first predetermined voltage value being a voltage value of the capacitor detected by the voltage sensor when a discharge current of the electrical storage device flows to the capacitor in the first current path,
the second predetermined voltage value being a voltage value of the capacitor detected by the voltage sensor when the discharge current of the electrical storage device flows to the capacitor in the second current path,
the predetermined voltage difference being a voltage difference between a voltage value of the capacitor detected by the voltage sensor when a signal for turning ON the relay is outputted and a voltage value of the capacitor detected by the voltage sensor when a signal for turning OFF the relay is outputted.

* * * * *